United States Patent
Hwang et al.

(10) Patent No.: US 11,250,986 B2
(45) Date of Patent: Feb. 15, 2022

(54) COIL COMPONENT

(71) Applicant: AMOGREENTECH CO., LTD., Gyeonggi-do (KR)

(72) Inventors: Seung Jae Hwang, Incheon (KR); Moon Hoe Kim, Gyeonggi-do (KR); Moon Young Hwang, Incheon (KR)

(73) Assignee: Amogreentech Co., Ltd., Gimpo-si (KR)

( * ) Notice: Subject to any disclaimer, the term of this patent is extended or adjusted under 35 U.S.C. 154(b) by 608 days.

(21) Appl. No.: 16/303,593

(22) PCT Filed: May 24, 2017

(86) PCT No.: PCT/KR2017/005422
§ 371 (c)(1),
(2) Date: Nov. 20, 2018

(87) PCT Pub. No.: WO2017/204562
PCT Pub. Date: Nov. 30, 2017

(65) Prior Publication Data
US 2019/0272948 A1    Sep. 5, 2019

(30) Foreign Application Priority Data
May 24, 2016    (KR) .................. 10-2016-0063666

(51) Int. Cl.
*H01F 27/24*    (2006.01)
*H01F 27/32*    (2006.01)
(Continued)

(52) U.S. Cl.
CPC ............ *H01F 27/325* (2013.01); *C09D 7/40* (2018.01); *C09D 201/00* (2013.01); *C09K 5/14* (2013.01);
(Continued)

(58) Field of Classification Search
CPC .............................. H01F 27/325; H01F 27/24
(Continued)

(56) References Cited

U.S. PATENT DOCUMENTS 7,280,027 B2 * 10/2007 Feth .................. H01F 17/062
336/206
7,449,986 B2 * 11/2008 Yamaguchi ............... H01F 5/04
336/192
(Continued)

FOREIGN PATENT DOCUMENTS

JP         08107597 A  *  4/1996
JP      2013-236051 A     11/2013
(Continued)

OTHER PUBLICATIONS

International Search Report cited in PCT/KR2017/005422, dated Sep. 26, 2017, 2 pgs.

*Primary Examiner* — Alexander Talpalatski
*Assistant Examiner* — Joselito S. Baisa
(74) *Attorney, Agent, or Firm* — Rothwell, Figg, Ernst & Manbeck, P.C.

(57) ABSTRACT

A coil component having a magnetic core, a bobbin accommodating the magnetic core, and at least one pair of coils wound around the outer part of the bobbin. The bobbin is implemented as a heat radiating member comprising: a polymer matrix; and graphite-nano metal composites which are provided in a plurality, are dispersed on the polymer matrix, and have nano-metal particles bonded to the surface of graphite. Accordingly, the heat generated from a coil component due to an applied current can most quickly and efficiently be conducted and radiated outside, and thus degrading of common-mode-noise rejection function is prevented and a differential signal can substantially be passed without attenuation. In addition, in spite of the heat gener- (Continued)

ated from the coil component or external physical and chemical stimulation, heat radiating properties can last for a long time.

19 Claims, 15 Drawing Sheets

(51) Int. Cl.
    *H01F 27/40*     (2006.01)
    *H01F 27/28*     (2006.01)
    *C09D 7/40*     (2018.01)
    *C09K 5/14*     (2006.01)
    *H05K 7/20*     (2006.01)
    *C09D 201/00*     (2006.01)

(52) U.S. Cl.
    CPC .............. *H01F 27/24* (2013.01); *H01F 27/28* (2013.01); *H01F 27/32* (2013.01); *H01F 27/402* (2013.01); *H05K 7/20* (2013.01); *H01F 2027/406* (2013.01)

(58) Field of Classification Search
    USPC .................................................. 336/219, 198
    See application file for complete search history.

(56) References Cited

U.S. PATENT DOCUMENTS

| | | | |
|---|---|---|---|
| 8,091,211 B2 * | 1/2012 | Hasu | H01F 27/2847 |
| | | | 29/605 |
| 8,158,730 B2 * | 4/2012 | Miyamoto | C08G 69/36 |
| | | | 525/419 |
| 8,493,167 B2 * | 7/2013 | Kim | H01F 27/085 |
| | | | 336/61 |
| 8,624,698 B2 * | 1/2014 | Kim | H01F 27/306 |
| | | | 336/198 |
| 8,896,404 B2 * | 11/2014 | Won | H01F 27/29 |
| | | | 336/198 |
| 9,437,360 B2 * | 9/2016 | Yang | H01F 27/306 |
| 9,640,309 B2 * | 5/2017 | Park | H02M 1/14 |
| 9,980,396 B1 * | 5/2018 | Folker | H05K 1/00 |
| 10,395,815 B2 * | 8/2019 | Yang | H01F 27/2876 |
| 10,770,217 B2 * | 9/2020 | Aarab | H01F 27/06 |
| 2013/0293330 A1 * | 11/2013 | Wu | H01F 5/02 |
| | | | 336/61 |
| 2014/0176291 A1 | 6/2014 | Zheng et al. | |
| 2018/0350512 A1 * | 12/2018 | Yang | H01F 27/2823 |
| 2018/0374633 A1 * | 12/2018 | Komiyama | H01F 27/2828 |

FOREIGN PATENT DOCUMENTS

| | | | | |
|---|---|---|---|---|
| KR | 10-2006-0086937 A | | 8/2006 | |
| KR | 10-2013-0116992 A | | 10/2013 | |
| KR | 101453221 B1 * | | 10/2014 | ............ B82Y 30/00 |
| KR | 10-1457797 B1 | | 11/2014 | |
| KR | 10-2015-0114862 A | | 10/2015 | |
| WO | 2005024942 A1 | | 3/2005 | |

* cited by examiner

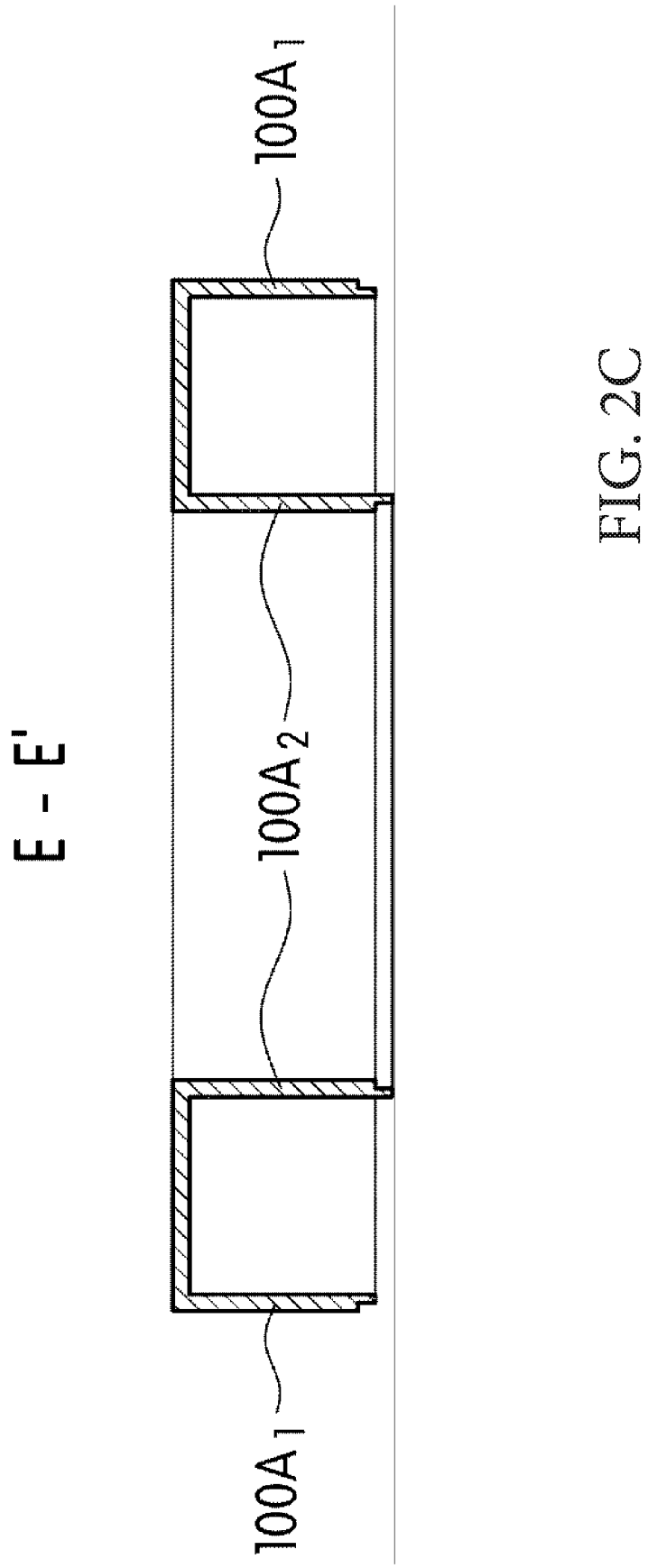

COIL COMPONENT

CROSS REFERENCE TO RELATED APPLICATION

This application is a 35 U.S.C. 371 National Phase Entry Application from PCT/KR2017/005422, filed May 24, 2017, which claims the benefit of Korean Patent Application No. 10-2016-0063666 filed on May 24, 2016, the disclosures of which are incorporated herein in their entirety by reference.

TECHNICAL FIELD

The present invention relates to a coil component, and more specifically, to a coil component in which heat generated in the coil component due to an applied current is conducted and radiated to the outside as rapidly and efficiently as possible, whereby a function of the coil component is prevented from being reduced and various devices equipped with the coil component are prevented from malfunctioning due to the heat generated in the coil component.

BACKGROUND ART

A coil component means a component assembled with a magnetic core and a coil. The coil component is used as a circuit component such as an inductor, a choke, a transformer, a reactor, or the like by changing physical properties exhibited by adjusting a material and a magnetic property of the magnetic core, a wire diameter and a material of the core, and the like.

In an example, when the coil component is used as the transformer, the coil component functions to change a value of a current or voltage of power applied to the coil by using an electromagnetic induction phenomenon and thus is applied in an electric transformer or the like. In addition, in an example, when the coil component is used as the inductor, the coil component functions as a filter for preventing damage to a circuit due to an abrupt change in applied current and for filtering electrical noise and thus is applied in an oscillation circuit, a power circuit, and the like of various electronic products.

On the other hand, when power is applied to the coil, heat is generated due to a resistance or the like of the coil. When the applied current or voltage is increased, higher heat is generated to cause an increase in resistance value of the coil. Thus, initially set physical properties of the coil component may not be fully exhibited.

In addition, commonly, in a coil component, a magnetic core and a wound coil are separated, the magnetic core is accommodated in an outer case in order to protect the magnetic core, and then the coil is wound on the outer case. However, a current applied to the coil may generate heat in the magnetic core due to an eddy current, and the generated heat may not be radiated to the outside due to the outer case. Thus, a heating problem of the coil component may become more serious. The heat generated in the coil component may affect the other components of various devices equipped with the coil component, resulting in malfunction of the devices.

Accordingly, it is urgent to research a coil component in which heat radiation performance is improved and is maintained for a long time.

Technical Solution

The present invention has been made in consideration of the above-mentioned actual circumstances and is directed to providing a coil component in which heat generated in the coil component due to an applied current is conducted and radiated to the outside as rapid and efficient as possible, whereby a function of the coil component is prevented from being reduced.

In addition, the present invention is directed to providing a coil component capable of maintaining heat radiation performance for a long time even with heat generated in the coil component and external physical and chemical stimulus.

Furthermore, the present invention is directed to providing a coil component in which heat generated in the coil component is high efficiently conducted and radiated to the outside and an outer surface of the coil component concurrently exhibits an excellent insulating property, thereby preventing an electrical shutdown caused by a short circuit, and a bobbin for a coil component.

In addition, the present invention is directed to providing various electronic components such as an electric transformer and a power factor correction (PFC) circuit and various electronic devices which include a coil component according to the present invention which has excellent heat radiation performance and insulating/heat radiation fastness.

In order to solve the above problems, the present invention provides a coil component including a magnetic core, a bobbin configured to accommodate the magnetic core, and at least one pair of coils wound outside the bobbin, wherein the bobbin is a heat radiation member which includes a polymer matrix and a plurality of graphite-nano metal composites which are dispersed on the polymer matrix, and each include nano metal particles bonded to a surface of graphite.

According to an exemplary embodiment of the present invention, the nano metal particles may be crystallized nanoparticles.

The graphite-nano metal composite may further include a polydopamine layer coated on the nano metal particles so as to improve an interfacial property between the polymer matrix and the graphite-nano metal composite. In this case, the dopamine layer may have a thickness of 5 nm to 1,000 nm.

The graphite-nano metal composite may be included in an amount of 10-95 wt % in the heat radiation member.

The nano metal may include at least one selected from the group consisting of Ni, Si, Ti, Cr, Mn, Fe, Co, Cu, Sn, In, Pt, Au, and Mg.

The coil component may further include a thermal interface material which fills an empty space in the bobbin accommodating the magnetic core The heat radiation member may further include an insulating film on an outer surface thereof that is made of at least one polymer component selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a methacrylic-based resin, polyamide, polyester, polycarbonate, polyphenylene sulfide, polyamideimide, polyvinyl butyral, polyvinyl formal, polyhydroxy polyether, polyether, polypthalamide, a phenoxy resin, polyurethane, a nitrile butadiene resin, a urea-based resin (UF), a melamine-based resin (MF), an unsaturated polyester resin (UP), an epoxy resin, and a silicon resin. The coil component may further include an insulating heat radiation coating layer on an outer surface of the bobbin. The coil component may further include an insulating heat radiation coating layer coated on an outer surface of the bobbin and an outer surface of the coil component, which includes the coils wound outside the bobbin.

The insulating heat radiation coating layer may be formed by treating an insulating heat radiation coating composition on the outer surface of the bobbin, wherein the insulating heat radiation coating composition includes a coating layer-forming component including a main resin and an insulating heat radiation filler.

The main resin may be a curable resin, and the coating layer-forming component may further include a curing agent included in an amount of 25-100 parts by weight with respect to 100 parts by weight of the main resin.

The insulating heat radiation filler may be included in an amount of 25-70 parts by weight with respect to 100 parts by weight of the main resin.

The main resin may include a compound represented by Formula 1 below:

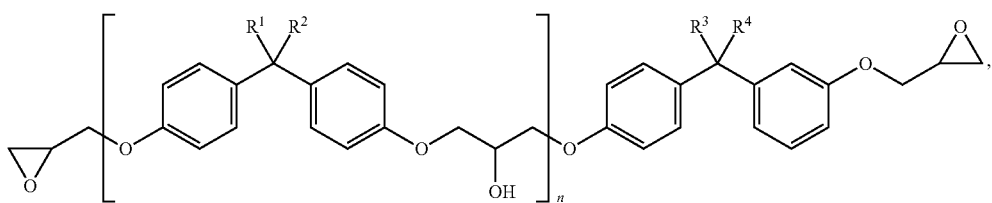

wherein $R^1$ and $R^2$ are each independently a hydrogen atom, a $C_1$-$C_5$ linear alkyl group, or a $C_3$-$C_5$ branched alkyl group, and $R^3$ and $R^4$ are each independently a hydrogen atom, a $C_1$-$C_5$ linear alkyl group, or a $C_3$-$C_5$ branched alkyl group, and n is a rational number which allows a weight average molecular weight of the compound represented by Formula 1 to be in a range of 400 to 4,000.

The curing agent may include a first curing agent and a second curing agent in a weight ratio of 1:0.5 to 1:1.5, wherein the first curing agent includes an aliphatic polyamine-based curing agent and the second curing agent includes at least one selected from the group consisting of an aromatic polyamine-based curing agent, an acid anhydride-based curing agent, and a catalyst-based curing agent.

The aliphatic polyamine-based curing agent may include polyethylene polyamine.

The insulating heat radiation filler may include at least one selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide, and manganese oxide. The insulating heat radiation filler may include silicon carbide.

The insulating heat radiation filler may have an average particle diameter of 10 nm to 15 μm. A D50 to D97 ratio of the insulating heat radiation filler may be less than or equal to 1:4.5.

The insulating heat radiation coating composition may have a heat radiation efficiency of 30% or more according to a thermal radiation evaluation method below:

[Heat Radiation Evaluation Method]

After a heat source having a surface area of 4 cm² and a temperature of 88° C. is placed to be in contact with a lower center of specimen 1 which includes a 25-μm thick insulating heat radiation coating layer formed by treating an insulating heat radiation coating composition on an upper surface of an aluminum plate having a thickness of 1.5 mm and an area of 35 mm×34 mm in a closed system having a temperature of 25° C. and a humidity of 50%, temperature is measured at an upper point located 5 cm from a center of specimen 1, temperature is measured in the same manner solely on specimen 2, that is, an aluminum plate on which a heat radiation coating layer is not formed, and a heat radiation efficiency is measured according to Expression 1 below:

heat radiation efficiency (%)={(temperature (° C.) of upper point located 5 cm from center of specimen 1)/(temperature (° C.) of upper point located 5 cm from center of specimen 2)−1}× 100.  [Expression 1]

The present invention provides a bobbin for a coil component including a magnetic core, the bobbin accommodating the magnetic core and having an outer surface on which a coil is wound, wherein the bobbin is a heat radiation member which includes a polymer matrix and a plurality of graphite-nano metal composites which are dispersed on the polymer matrix and each includes nano metal particles bonded to a surface of graphite.

According to an embodiment of the present invention, the bobbin may further include an insulating heat radiation coating layer coated on an outer surface of the heat radiation filler.

The present invention provides a coil component including: a magnetic core; a bobbin configured to accommodate the magnetic core; and at least one pair of coils wound outside the bobbin, wherein the coil component further includes an insulating heat radiation coating layer coated on an outer surface of the bobbin and an outer surface of the coil component, which includes the coils wound outside the bobbin.

The present invention provides a coil component including: a magnetic core; an insulating film covering the magnetic core; at least one pair of coils wound outside the insulating film; and an insulating heat radiation coating layer coated on an outer surface of the insulating film and an outer surface of the coil component, which includes the coils wound outside the insulating film.

The present invention provides a transformer, an electromagnetic interference (EMI) filter, a power factor correction (PFC) circuit, an electronic device, or a vehicle, which includes a coil component according to the present invention.

Advantageous Effects

According to the present invention, heat generated in the coil component due to an applied current may be conducted and radiated to the outside as rapidly and efficiently as possible so that a function of the coil component may be prevented from being reduced. In addition, heat radiation performance may be maintained for a long time even with the heat generated in the coil component and external physical and chemical stimulus. Furthermore, according to the present invention, the heat generated in the coil component is highly efficiently conducted and radiated to the outside and an outer surface of the coil component concurrently exhibits an excellent insulating property, thereby preventing an electrical shutdown caused by a short circuit. In addition, the coil component according to the present invention having excellent heat radiation performance and insulating/heat radiation fastness may be widely applied in all industries including in an electric transformer, an electromagnetic interference (EMI) filter, a power factor correction (PFC) circuit, an electronic device, a vehicle, and the like.

DESCRIPTION OF DRAWINGS

FIG. 3 is a set of views illustrating a coil component according to an exemplary embodiment of the present invention.

FIG. 4 is a set of views illustrating a coil component according to an exemplary embodiment of the present invention.

FIG. 5 is a set of views illustrating a coil component according to an exemplary embodiment of the present invention.

FIG. 7 is a set of images showing a coil component according to an exemplary embodiment of the present invention.

MODES OF THE INVENTION

Figure 1:
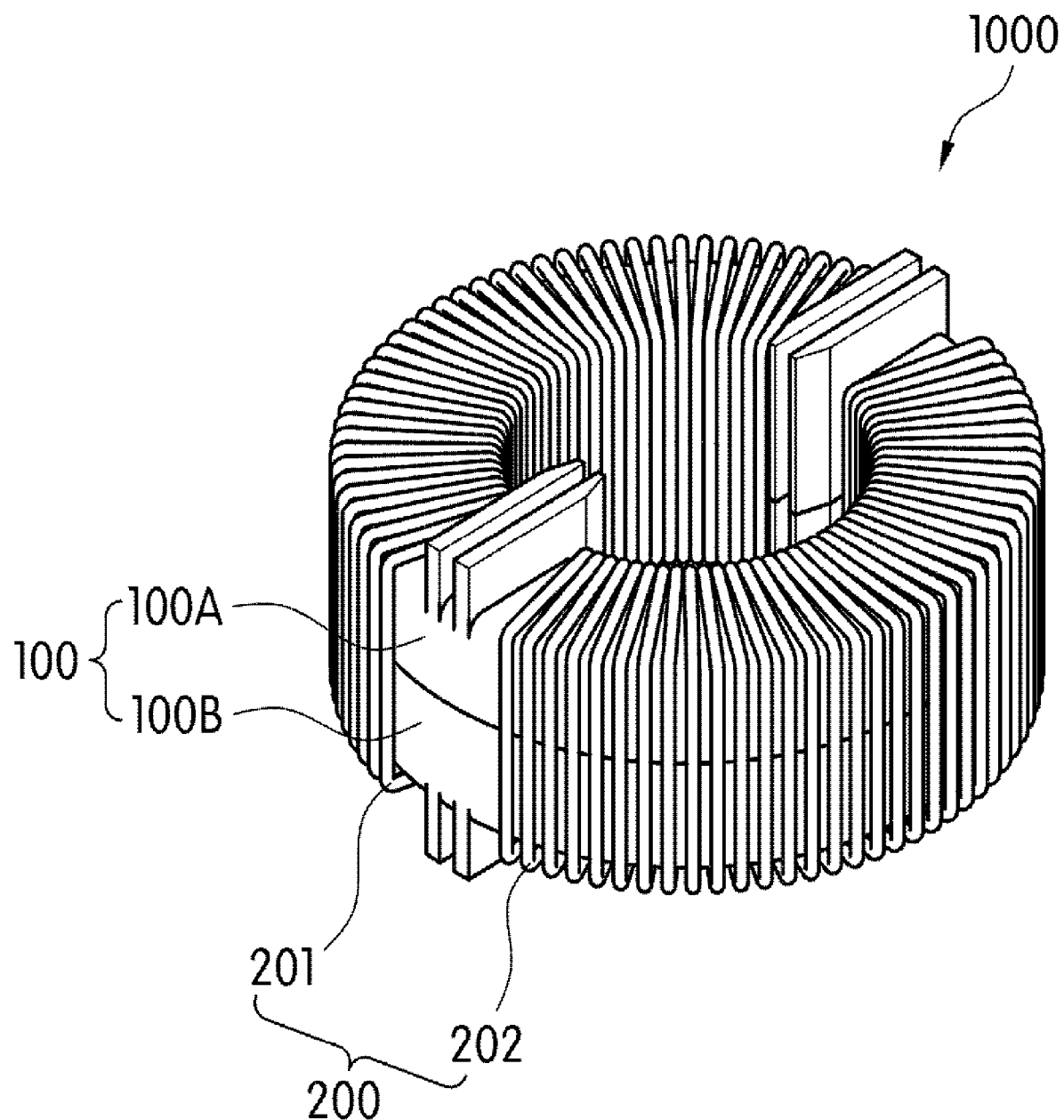
FIG. 1 is a perspective view illustrating a coil component according to an exemplary embodiment of the present invention.

Hereinafter, exemplary embodiments of the present invention will be described in detail with reference to the accompanying drawings so as to be easily practiced by a person of ordinary skill in the art. It should be understood that the present invention may be embodied in different ways and is not limited to the following exemplary embodiments. Parts irrelevant to description are omitted in the drawings in order to clearly explain embodiments of the present invention, and like reference numerals refer to like elements throughout the specification.

As shown in FIG. 1, a coil component 1000 includes a pair of coils 201 and 202 which divide an outer surface of a bobbin 100 accommodating a magnetic core (not shown) and are separately wound in divided regions of the outer surface.

Figure 2A:
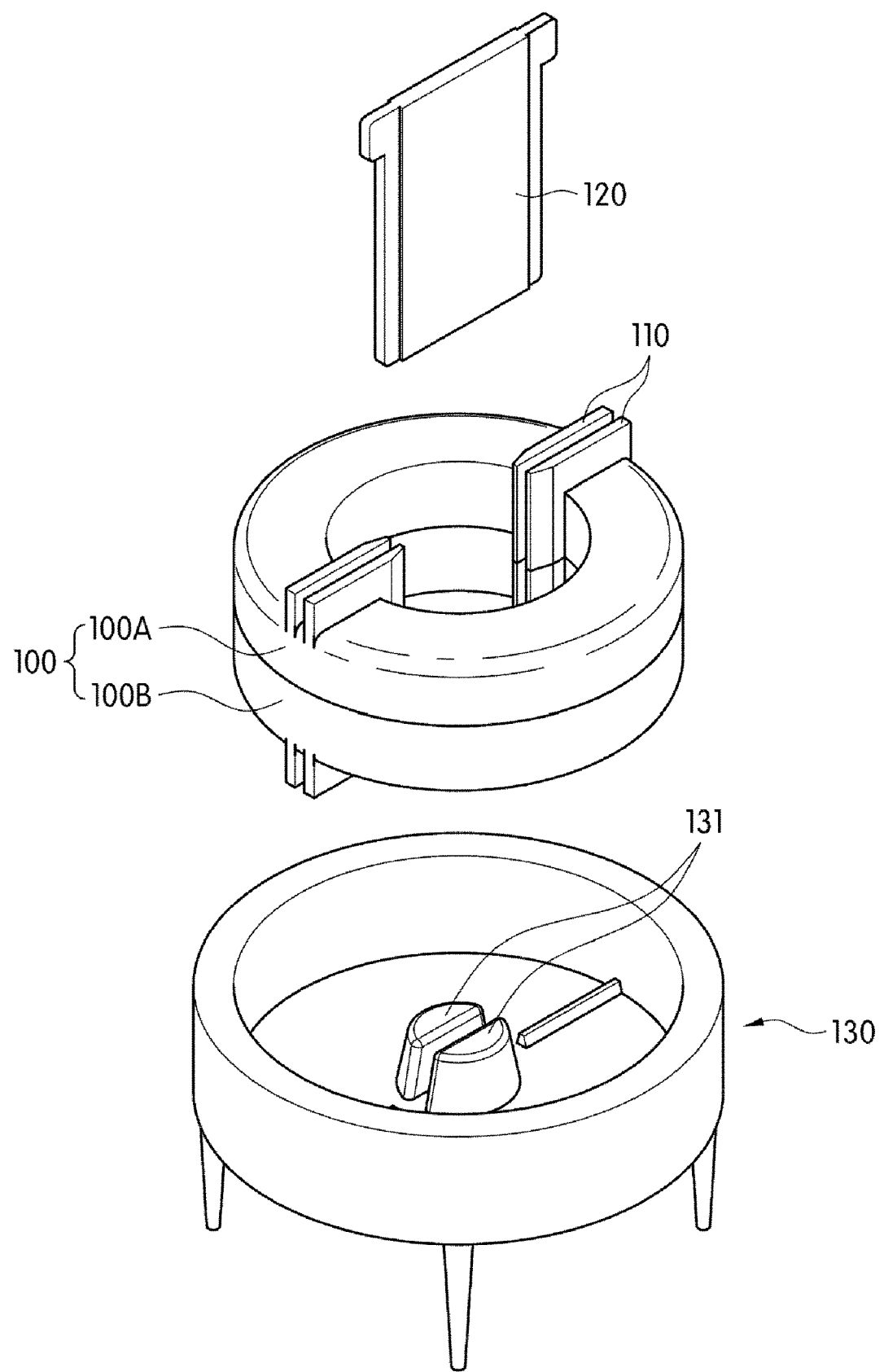
FIG. 2A is a perspective view illustrating the coil component excluding the coil.
Figure 2B:
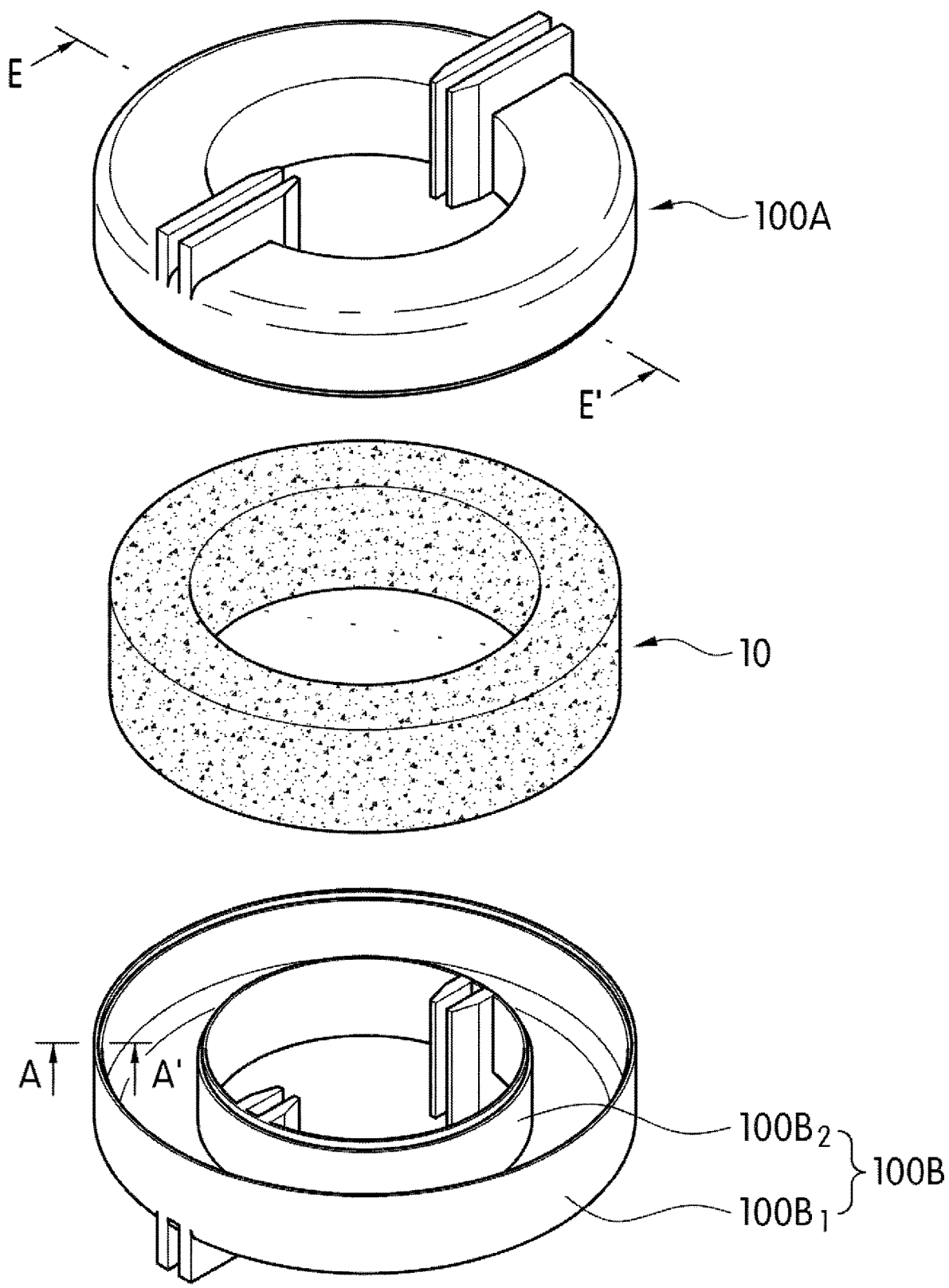
FIG. 2B is an exploded perspective view illustrating the coil component excluding the coil.

In an example, as shown in FIGS. 2A and 2B, the bobbin 100 may be implemented to have a structure accommodating a magnetic core 10 therein by coupling an upper bobbin 100A and a lower bobbin 100B. The coupled bobbin 100 may integrally form a coil component in such a manner that after a portion of the lower bobbin 100B is accommodated in a base member 130, a central separator plate 120 is fitted along a coupling guide 110 provided in inner surfaces of the upper bobbin 100A and the lower bobbin 100B and is finally coupled to a coupling protrusion 131 of the base member 130.

Inner and/or outer shapes of the upper bobbin 100A and the lower bobbin 100B may be changed according to a shape of the accommodated magnetic core 10.

In an example, the magnetic core 10 may have a cylindrical shape with a hollow portion or a donut shape with a hollow portion. As shown in FIGS. 2B and 2C, the bobbins 100A and 100B may have curved outer walls $100A_1$ and $100B_1$ and curved inner walls $100A_2$ and $100B_2$ so as to surround an outer side and an inner side of the hollow magnetic core 10. In addition, a stepped portion having a certain depth may be formed in at least a portion of the outer walls $100A_1$ and $100B_1$ and the inner walls $100A_2$ and $100B_2$ of the coupled upper and lower bobbins 100A and 100B such that after the magnetic core 10 is accommodated in a space between the outer walls $100A_1$ and $100B_1$ and the inner walls $100A_2$ and $100B_2$, the upper bobbin 100A and the lower bobbin 100B are forcibly fitted to each other.

The bobbin 100 may be a heat radiation member. Describing this with reference to FIG. 2D, the bobbin includes a polymer matrix 101 and a plurality of graphite-nano metal composites 102 which are dispersed on the polymer matrix, and each include nano metal particles 102b bonded to a surface of the graphite 102a. The bobbin 100 may further include an insulating film 103 formed on at least an outer surface thereof.

The polymer matrix 101 may be made of at least one selected from a thermosetting polymer component and a thermoplastic polymer component. The thermosetting polymer component may include at least one selected from the group consisting of an epoxy-based component, a urethane-based component, a melamine-based component, and a polyimide-based component. The thermoplastic component may include at least one selected from the group consisting of a polycarbonate-based component, a polystyrene-based component, a polysulfone-based component, a polyvinyl chloride-based component, a polyether-based component, a polyacrylate-based component, a polyester-based component, a polyamide-based component, a cellulose-based component, a polyolefin-based component, and a polypropylene-based component.

In addition, the graphite-nano metal composite 102 may be a composite in which at least one nano metal particle 102b is bonded to the surface of the graphite 102a. The nano metal particle may be included in an amount of 20-50 parts by weight with respect to the total weight, i.e., 100 parts by weight of the graphite in the entirety of the plurality of provided graphite-nano metal composites. Furthermore, a nano metal may be bonded at high density to occupy a surface range of 30% to 70% of a surface area of the graphite.

The graphite 102a is a mineral in which planar macromolecules formed by infinitely connecting 6-membered rings of carbon atoms in a planar form are layered and stacked. The graphite 102a includes graphene as a basic element. The graphite 102a may have a plate shape and may include a single layer of graphene or a layered structure in which a plurality of graphenes are stacked. The layered structure may form a graphite nanosheet exfoliated according to a weak interaction between the inter layers. Due to in-plane metallic bonding and a weak van der Waals interaction between inter-spaced layers inside the graphite in the form of the layered structure, electrical and thermal anisotropy may be exhibited. Graphite obtained through various methods known in the art may be used in the present invention without limitation.

The nano metal particle 102b may be a conductive metal capable of exhibiting an electromagnetic wave shielding effect. The nano metal particle may include at least one selected from the group consisting of Ni, Si, Ti, Cr, Mn, Fe, Co, Cu, Sn, In, Pt, Au, and Mg.

In this case, the nano metal and the graphite may be bonded through a chemical bond or the like. The nano metal may be crystallized and may be a crystal size, i.e., an average particle diameter of 10 nm to 200 nm, and preferably, 50 nm to 200 nm. As a result, contact may be improved to lower contact resistance, thereby improving thermal and/or electrical properties.

In addition, in order to improve an interfacial property between the polymer matrix and the graphite-nano metal composite, the graphite-nano metal composite may further include a polydopamine layer coated on the nano metal particle. Due to the improvement in interfacial property between the polymer matrix and the graphite-nano metal composite, since a graphite heat radiation member in the form of a sheet is formed even when a small amount of a matrix-forming component is added, a content of the graphite-nano metal composite may be increased in the heat radiation member. Thus, a heat radiation property may be further improved due to the graphite-nano metal composite. Accordingly, the heat radiation member may include the graphite-nano metal composite 102 in an amount of 10 wt % or more, and more preferably, 10-95 wt % with respect to the total weight of the heat radiation member. Although the graphite-nano metal composite 102 is included in a large amount, the heat radiation member may have excellent maintainability and may exhibit mechanical strength of a certain level or more.

In addition, since the polydopamine layer coated on the graphite-nano metal composite improves dispersibility inside an organic solvent, it may be easier to uniformly place the graphite-nano metal composite in the polymer matrix when the graphite-nano metal composite is formed into the heat radiation member.

A thickness of the polydopamine layer may be in a range of 5 nm to 1,000 nm. When the thickness is less than 5 nm, an interfacial property and dispersibility through the polydopamine layer may not reach a desired level. When the thickness exceeds 1,000 nm, a degree of improvement in physical properties may be insignificant.

Furthermore, a bond method between the graphite and the nano metal particles of the graphite-nano metal composite 102 is not particularly limited in the present invention. In an example, first, the graphite and the nano metal particles are mixed to prepare a graphite-nano metal particle mixture, plasma is applied to the graphite-nano metal particle mixture to vaporize the nano metal particles, and a quenching gas is injected into the vaporized nano metal particles to condense or quench the vaporized nano metal particles. Therefore, the vaporized nano metal particles may be inhibited from growing, and the nano metal particles may be crystallized on a surface of the graphite to form the graphite-nano metal composite 102. After that, a polydopamine layer may be further formed on the nano metal particles of the formed graphite-nano metal composite 102. The polydopamine layer may be formed by dipping the graphite-nano metal composite 102 in a dopamine aqueous solution. In this case, when a basic dopamine aqueous solution is used as the dopamine aqueous solution, dopamine spontaneously reacts under an oxidizing condition and is polymerized on the nano metal particles of the graphite-nano metal composite to form the polydopamine layer. Therefore, a separate sintering process is not required. Although addition of an oxidizing agent is not particularly limited, an oxygen gas in the air may be used as the oxidizing agent without adding the oxidizing agent. A dipping time determines a thickness of a coating layer. In the case of using a dopamine aqueous solution prepared by dissolving dopamine in a basic tris buffer solution having a pH of 8 to 14 such that the dopamine has a concentration of 0.1 mg/mL to 5 mg/mL, a graphite-nano metal may be dipped for 0.5 hours to 24 hours in order to form a coating layer so as to have a thickness of 5 nm to 100 nm. On the other hand, even when the graphite is dipped in the dopamine aqueous solution, it is difficult for a dopamine coating layer to be formed on a surface of the graphite. However, since the dopamine coating layer is easily formed on the nano metal particles bonded to the surface of the graphite, the composite may further include the polydopamine layer.

Figure 2D:
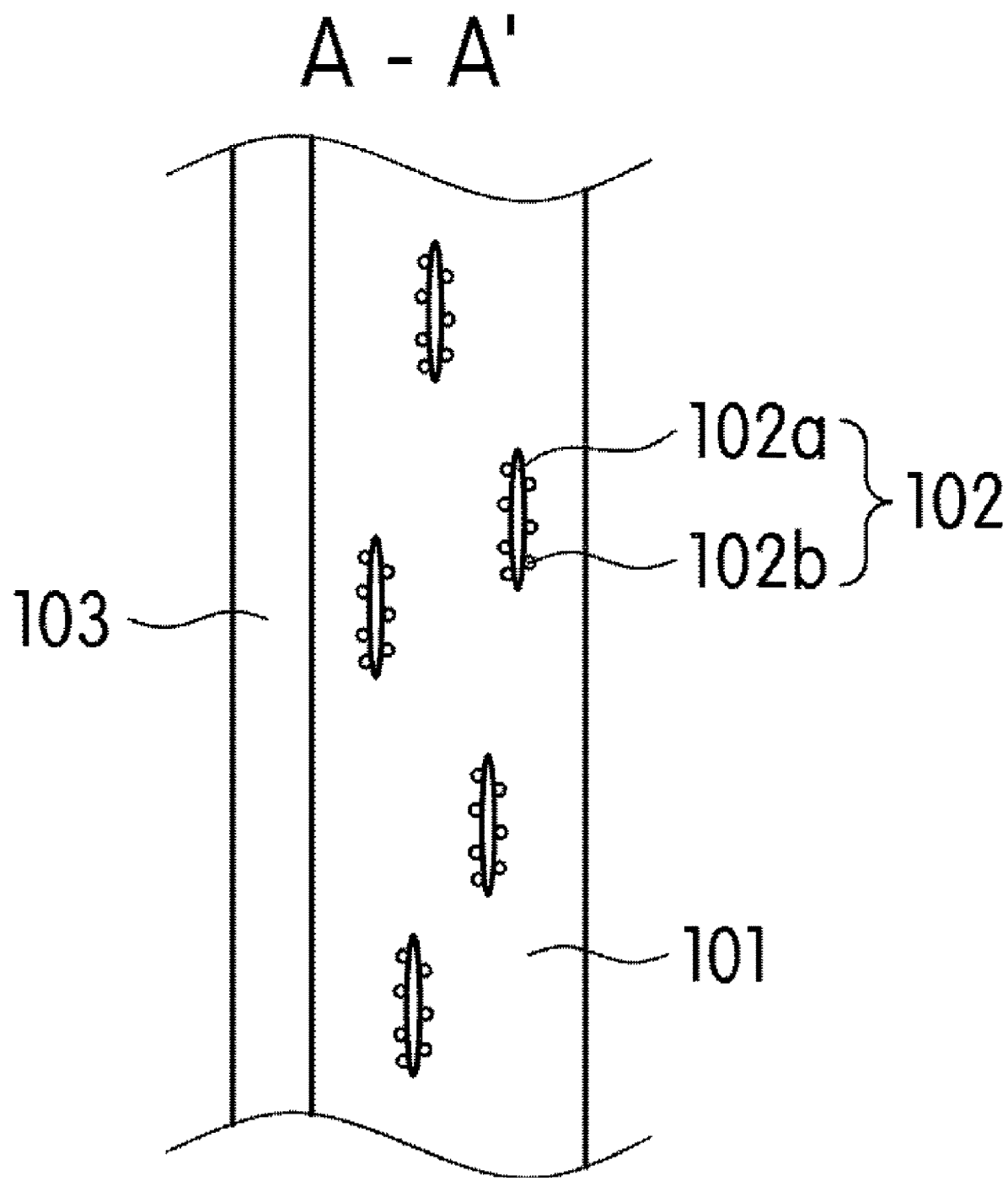
FIG. 2 is a set of views illustrating parts of the coil component according to the exemplary embodiment of the present invention excluding a coil.
FIG. 2C is a cross-sectional view of a bobbin taken along boundary line E-E' in FIG. 2B, and FIGS. 2D and 2E are views illustrating several exemplary embodiments of a cross section of the bobbin taken along boundary line A-A'.

After a polymer component of the polymer matrix 101 and the graphite-nano metal composite 102 are mixed, the heat radiation member 101 and 102 may further include a curing agent, a solvent, and the like according to the selected polymer component. Alternatively, after the graphite-nano metal composite is mixed into a molten polymer component, the heart radiation member may be molded into a desired shape and solidified. In this case, a thickness of the heat radiation member may be changed according to desired mechanical strength and the like and may be, for example, in a range of 0.01 mm to 1,000 mm Meanwhile, as shown in FIG. 2d, the heat radiation member 101 and 102 may further include the insulating film 103 on an outer surface thereof that is made of at least one polymer component selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a methacrylic-based resin, polyamide, polyester, polycarbonate, polyphenylene sulfide, polyamideimide, polyvinyl butyral, polyvinyl formal, polyhydroxy polyether, polyether, polypthalamide, a phenoxy resin, polyurethane, a nitrile butadiene resin, a urea-based resin (UF), a melamine-based resin (MF), an unsaturated polyester resin (UP), an epoxy resin, and a silicon resin. This is to prevent a short circuit which may occur in a pair of separated coils wound on the outer surface of the bobbin, i.e., the heat radiation member due to electrical conductivity of the graphite-nano metal composite provided in the heat radiation member. A thickness of the insulating film 103 may be in a range of 0.1 mm to 10 mm, but the present invention is not limited thereto.

Figure 2E:
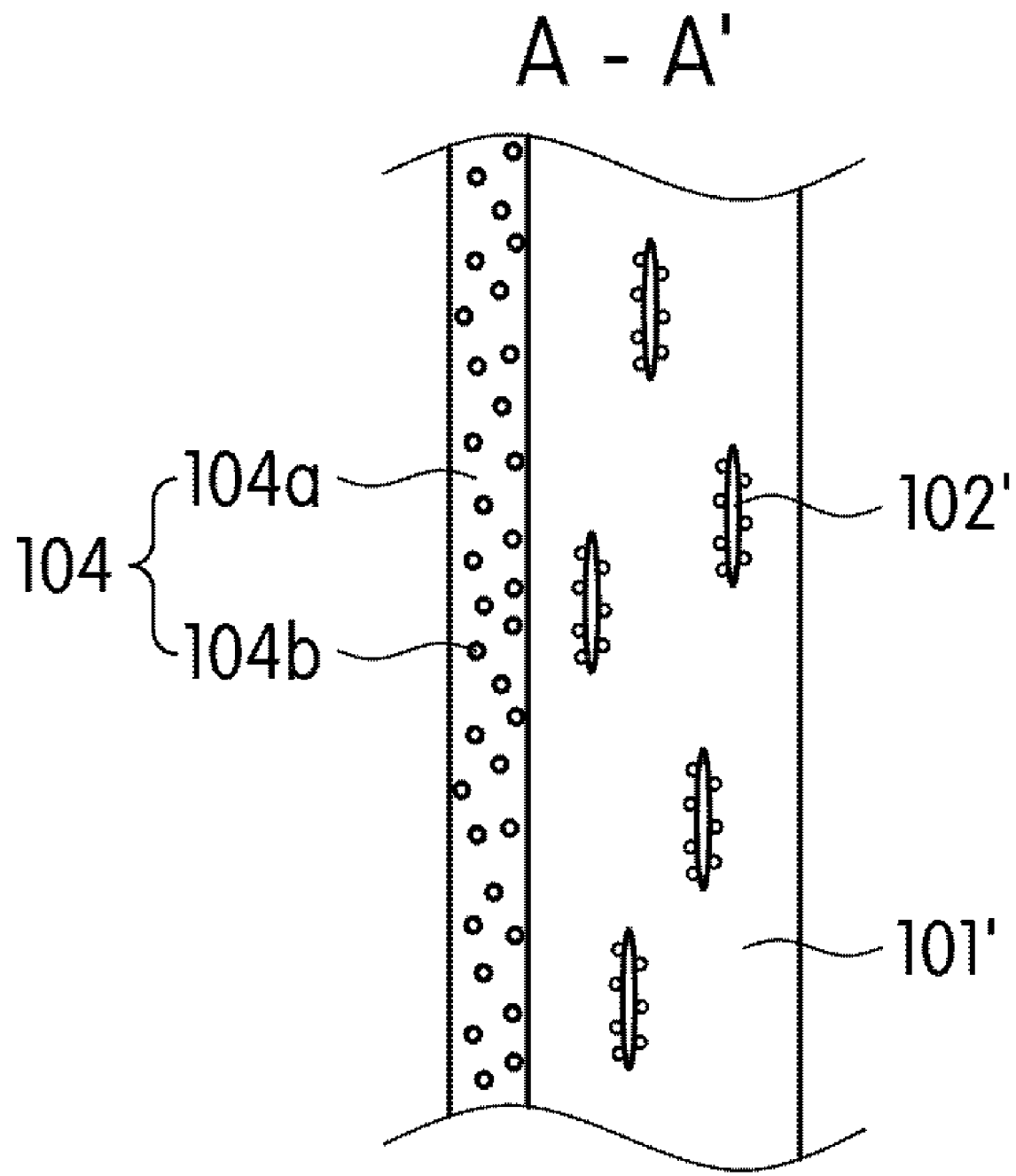

Alternatively, as shown in FIG. 2E, an insulating heat radiation coating layer 104 may be further provided on an outer surface of a heat radiation member 101' and 102'. The insulating heat radiation coating layer may include an insulating heat radiation filler 104b dispersed in a coating layer 104a. The insulating heat radiation coating layer 104 may be formed by treating an insulating heat radiation coating composition on the outer surface of the bobbin.

In an example, the insulating heat radiation coating composition may include a coating layer-forming component including a main resin and an insulating heat radiation filler. When the main resin is a curable resin, the insulating heat radiation coating composition may further include a curing agent.

The main resin may include any component without limitation as long as the component is capable of forming a coating layer and is known in the art. However, in order to concurrently achieve adhesion to a bobbin, a heat resistance property so as to not be embrittled by heat of a heating substrate, an insulating property so as to not be embrittled by electrical stimulation, mechanical strength, and improvement in heat radiation performance according to improvement in compatibility with an insulating heat radiation filler, the main resin may include one selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a methacrylic-resin resin, polyamide, polyester, polycarbonate, polyphenylene sulfide, polyamideimide, polyvinyl butyral, polyvinyl formal, polyhydroxy polyether, polyether, polypthalamide, a phenoxy resin, polyurethane, a nitrile butadiene resin, a urea-based resin (UF), a melamine-based resin (MF), an unsaturated polyester resin (UP), a silicone resin, an epoxy resin, mixtures thereof, and copolymers thereof. In an example, the main resin may include an acrylic melamine-based resin. Since a specific type corresponding to each of the resins is a resin known in the art, detailed descriptions thereof will be omitted in the present invention.

For example, when the main resin includes an epoxy resin, the main resin may include an epoxy resin including at least one selected from the group consisting of a glycidyl ether type epoxy resin, a glycidylamine type epoxy resin, a glycidyl ester type epoxy resin, a linear aliphatic type epoxy resin, a rubber-modified epoxy resin, and derivatives thereof.

Specifically, the glycidyl ether type epoxy resin may include glycidyl ether of phenol and glycidyl ether of an alcohol. The glycidyl ether of the phenol may include at least one selected from a bisphenol-based epoxy such as bisphenol type A, bisphenol type B, bisphenol type AD, bisphenol type S, bisphenol type F, or resorcinol, a phenol-based novolac such as phenol novolac epoxy, aralkyl phenol novolac, or terpene phenol novolac, and a cresol novolac-based epoxy resin such as o-cresol novolac epoxy. These may be used alone or in a combination of two or more thereof.

The glycidylamine type epoxy resin may include diglycidyl aniline, tetraglycidyl diaminodiphenyl methane, N,N, N',N'-tetraglycidyl-m-xylylenediamine, 1,3-bis(diglycidylaminomethyl)cyclohexane, and triglycidyl-m-aminophenol and triglycidyl-p-aminophenol having both structures of glycidyl ether and glycidylamine, or the like. These may be used alone or in a combination of two or more thereof.

The glycidyl ester type epoxy resin may include an epoxy resin due to a hydroxycarboxylic acid such as a p-hydroxybenzoic acid or a β-hydroxynaphthoic acid, a polycarboxylic acid such as a phthalic acid or a terephthalic acid, or the like. These may be used alone or in a combination of two or more thereof.

The linear aliphatic type epoxy resin may include glycidyl ether due to 1,4-butanediol, 1,6-hexanediol, neopentyl glycol, cyclohexane dimethanol, glycerin, trimethylol ethane, trimethylol propane, pentaerythritol, dodecahydrobisphenol A, dodecahydrobisphenol F, ethylene glycol, propylene glycol, polyethylene glycol, polypropylene glycol, or the like. These may be used alone or in a combination of two or more thereof.

The rubber-modified epoxy resin is not particularly limited as long as its skeleton is an epoxy resin having rubber and/or polyether. In an example, the rubber-modified epoxy resin may be a rubber-modified epoxy resin such as an epoxy resin chemically bonded with a carboxy-modified butadiene-acrylonitrile elastomer in a molecule (CTBN-modified epoxy resin), an acrylonitrile-butadiene rubber-modified epoxy resin (NBR-modified epoxy resin), an urethane-modified epoxy resin, or a silicone-modified epoxy resin. These may be used alone or in a combination of two or more thereof.

However, in terms of securing excellent compatibility with an insulating heat radiation filler to be described later, in particular, silicon carbide of the insulating heat radiation filler, in terms of improving a heat radiation property, in terms of improving durability and surface quality of an insulating heat radiation coating layer, and in terms of improving dispersibility of the heat radiation filler, in an example, the main resin may include a compound represented by Formula 1 below:

[Formula 1]

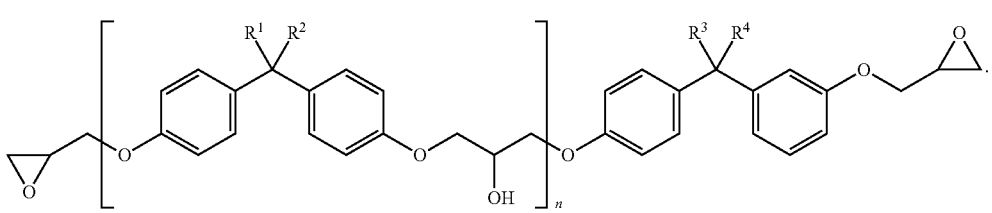

$R^1$ and $R^2$ are each independently a hydrogen atom, a $C_1$-$C_5$ linear alkyl group, or a $C_3$-$C_5$ branched alkyl group, and preferably, a hydrogen atom, a $C_1$-$C_3$ linear alkyl group, or a $C_3$-$C_4$ branched alkyl group. $R^3$ and $R^4$ are each independently a hydrogen atom, a $C_1$-$C_5$ linear alkyl group, or a $C_3$-$C_5$ branched alkyl group, and preferably, a hydrogen atom, a $C_1$-$C_3$ linear alkyl group, or a $C_3$-$C_4$ branched alkyl group. N is a rational number which allows a weight average molecular weight of the compound represented by Formula 1 to be in a range of 400 to 4,000, and preferably, in a range of 450 to 3,900.

When the weight average molecular weight of the compound represented by Formula 1 is less than 400, flowability of a coating composition may be increased to make it difficult to form an insulating heat radiation coating layer. Even after the insulating heat radiation coating layer is formed, adhesive strength with respect to a surface to be coated may be decreased. When the weight average molecular weight exceeds 4,000, it is difficult to prepare an insulating heat radiation coating layer having a uniform thickness. Dispersibility of a heat radiation filler in a coating composition may be decreased to make it difficult to exhibit uniform insulating and heat radiation performance when an insulating heat radiation coating layer is formed.

In addition, a type of the curing agent included in the coating layer-forming component together with the above-described epoxy resin usable as the main resin may be changed according to a specific type of selectable epoxy. A specific type of the curing agent may include a curing agent known in the art and, preferably, may include at least one component selected from an aliphatic polyamine-based curing agent, an aromatic polyamine-based curing agent, an acid anhydride-based curing agent, and a catalyst-based curing agent.

Specifically, the aliphatic polyamine-based curing agent may be, for example, polyethylene polyamine and preferably may include at least one selected from the group consisting of diethylenetriamine (DETA), diethylaminopropylamine (DEAPA), triethylenetetramine (TETA), tetraethylenepentamine (TEPA), and menthanediamine (MDA).

In addition, the aromatic polyamine-based curing agent may include at least one selected from the group consisting of metaphenylenediamine (MPDA), diaminodiphenylsulfone (DDS), and diphenyldiaminomethane (DDM).

Furthermore, the acid anhydride-based curing agent may include, for example, at least one selected from the group consisting of phthalic anhydride (PA), tetrahydrophthalic anhydride (THPA), methyltetrahydrophthalic anhydride (MTHPA), hexahydrophthalic anhydride (HHPA), and methyl nadic anhydride (MNA).

In addition, the catalyst-based curing agent may include, for example, at least one catalyst-based curing agent selected from the group consisting of dicyandiamide (DICY), melamine, polymercaptan, methylenediphenyl diisocyanate (MDI), toluene diisocyanate (TDI), $BF_3$ monoethylamine ($BF_3$-MEA), benzyldimethylamine (BDMA), and phenyl imidazole.

Meanwhile, according to an exemplary embodiment of the present invention, when the main resin includes the compound represented by Formula 1, the coating layer-forming component may include a first curing agent including an aliphatic polyamine-based curing agent as a curing agent and a second curing agent including at least one selected from the group consisting of an aromatic polyamine-based curing agent, an acid anhydride-based curing agent, and a catalyst-based curing agent. As a result, it is very advantageous for improving compatibility with an insulating heat radiation filler to be described below, in particular, silicon carbide, and it is advantageous in all physical properties such as adhesion, durability, and surface quality of an insulating heat radiation coating layer. In addition, when a curved portion or a stepped portion rather than a flat portion is formed in a surface to be adhered, on which the heat radiation coating composition is applied, it is advantageous to further prevent cracks and peeling from being generated in an insulating heat radiation coating layer formed on a corresponding portion. Furthermore, in order to exhibit improved physical properties, the curing agent may include the first curing agent and the second curing agent, preferably, in a weight ratio of 1:0.5 to 1:1.5, and more preferably, in a weight ratio of 1:0.6 to 1:1.4. When the weight ratio of the first curing agent to the second curing agent is less than 1:0.5, adhesion strength to an adherend may be weakened. When the weight ratio exceeds 1:1.4, elasticity and durability of a coating film may be decreased.

In addition, the coating layer-forming component may include 25-100 parts by weight of the curing agent and preferably 40-80 parts by weight of the curing agent with respect to 100 parts by weight of the main resin. When the curing agent is included in an amount less than 25 parts by weight, a resin may be uncured or durability of a formed insulating heat radiation coating layer may be decreased. In addition, when the curing agent is included in an amount exceeding 100 parts by weight, cracks may be generated in the formed insulating heat radiation coating layer or the insulating heat radiation coating layer may be broken.

Next, an insulating heat radiation filler will be described.

The insulating heat radiation filler may include any material without limitation as long as the material has both of an insulating property and a heat radiation property. In addition, the shape and size of the insulating heat radiation filler are not limited. The insulating heat radiation filler may be porous or non-porous in terms of a structure and may be selected differently according to a purpose thereof. Thus, the present invention is not particularly limited thereto. In an example, the insulating heat radiation filler may include at least one selected from the group consisting of silicon carbide, magnesium oxide, titanium dioxide, aluminum nitride, silicon nitride, boron nitride, aluminum oxide, silica, zinc oxide, barium titanate, strontium titanate, beryllium oxide, manganese oxide, zirconia oxide, and boron oxide. In terms of facilitating achievement of desired physical properties such as excellent insulating and heat radiation performance, ease of formation of an insulating heat radiation coating layer, uniform insulating and heat radiation performance after the insulating heat radiation coating layer is formed, and surface quality of the insulating heat radiation coating layer, preferably, the insulating heat radiation filler may be silicon carbide.

In addition, a filler, of which a surface is modified by using a functional group such as a silane group, an amino group, an amine group, a hydroxyl group, or a carboxyl group, may be used as the insulating heat radiation filler. In this case, the functional group may be directly bonded to the surface of the filler or may be indirectly bonded to the filler through $C_1$-$C_{20}$ substituted or unsubstituted aliphatic hydrocarbon or $C_6$-$C_{14}$ substituted or unsubstituted aromatic hydrocarbon.

In addition, the insulating heat radiation filler may be a core-shell type filler in which a known conductive heat radiation filler such as a carbon or metal-based material is used as a core and an insulating component surrounds the core.

Furthermore, the insulating heat radiation filler may have an average particle diameter of 10 nm to 15 μm, and preferably, an average particle diameter of 30 nm to 12 μm. When the average particle diameter is less than 10 nm, product unit costs may be increased. After the insulating heat radiation filler is formed into an insulating heat radiation coating layer, an amount of the insulating heat radiation filler emerging on a surface of the insulating heat radiation coating layer may be increased, thereby decreasing heat radiation performance. In addition, when the average particle diameter exceeds 15 µm, uniformity of a surface may be decreased. Meanwhile, a D50 to D97 ratio of the insulating heat radiation filler provided for improving dispersibility of a heat insulating heat radiation filler may be 1:4.5 or less, and preferably, in a range of 1:1.2 to 1:3.5. When the D50 to D97 ratio exceeds 1:4.5, uniformity of a surface may be decreased, and dispersibility of the heat radiation filler is poor. Accordingly, a heat radiation effect may not uniformly appear. Since the insulating heat radiation filler includes particles having relatively large particle diameters, thermal conductivity may be relatively high, but desired heat radiation properties may not be exhibited. D50 and D97 mean particle diameters of the insulating heat radiation filler when cumulative degrees in a volume accumulated particle size distribution are 50% and 97%, respectively. Specifically, in a graph (particle size distribution based on a volume) in which a particle diameter is shown on a horizontal axis and a volume cumulative frequency is shown on a vertical axis from the smallest particle diameter, particle diameters of particles, of which volume cumulative values (%) from the smallest particle diameter are respectively 50% and 97% of a volume cumulative value (100%) of the total particles, correspond to D50 and D97. The volume cumulative particle size distribution of the insulating heat radiation filler may be measured using a laser diffraction scattering particle size distribution device.

On the other hand, the average particle diameter of the insulating heat radiation filler may be changed according to a thickness of a coating film of an insulating heat radiation coating layer to be formed. In an example, when an insulating heat radiation coating layer having a thickness of 25 µm is formed, a heat radiation filler having an average particle diameter of 1 µm to 7 µm may be used. When an insulating heat radiation coating layer having a thickness of 35 µm is formed, a heat radiation filler having an average particle diameter of 8 µm to 12 µm may be used. However, in order to further improve dispersibility of a heat radiation filler in a composition, an insulating heat radiation filler, which satisfies both the average particle diameter range of the heat radiation filler and the ratio range of D50 to D97 according to the present invention, may be used.

The insulating heat radiation filler may be included in an amount of 25-70 parts by weight, and preferably, in an amount of 35-60 parts by weight in order to exhibit improved physical properties with respect to 100 parts by weight of the main resin. When the insulating heat radiation filler is included in an amount less than 25 parts by weight with respect to 100 parts by weight of the main resin, desired heat radiation performance may not be exhibited. In addition, when the insulating heat radiation filler is included in an amount exceeding 70 parts by weight, adhesive strength of an implemented insulating heat radiation coating layer may be decreased, and thus, the implemented insulating heat radiation coating layer may be easily peeled off. In addition, hardness of the insulating heat radiation coating layer may be increased, and thus, the insulating heat radiation coating layer may be easily cracked or broken by a physical impact. Furthermore, an amount of the heat radiation filler, which protrudes from a surface of the insulating heat radiation coating layer, may be increased to increase surface roughness, resulting in a reduction in surface quality of the insulating heat radiation coating layer. In addition, even when the insulating heat radiation filler is further provided, a degree of improvement in heat radiation performance may be insignificant. In order to implement a thin insulating heat radiation coating layer, in a process of applying a heat radiation coating composition on a surface to be coated, when coating is performed through some coating methods, i.e., a spraying method, it may be difficult to uniformly apply the composition on the surface to be coated. In addition, since dispersibility of a heat radiation filler dispersed in the composition may be decreased, although the composition is applied on the surface to be coated, the heat radiation filler may be nonuniformly dispersed and disposed. Thus, it may be difficult to exhibit uniform insulating and heat radiation performance on an entire surface of the insulating heat radiation coating layer.

Next, a physical property improving-component further included in an insulating heat radiation coating composition will be described.

The physical property-improving component allows a more improved insulating property/heat radiation property to be exhibited when the insulating heat radiation coating composition according to the present invention is coated on a surface to be coated and simultaneously allows excellent adhesion to be exhibited, thereby functioning to improve durability.

The physical property-improving component may be a silane-based compound, and known silane-based compounds applied in the art may be used without limitation. However, when the physical property-improving component is used together with the main resin of the above-described coating layer-forming component and silicon carbide of the insulating heat radiation filler, in order to exhibit considerable durability and heat radiation performance by causing synergism of desired physical properties, the physical property-improving component may include at least one selected from the group consisting of 3-[N-anil-N-(2-aminoethyl)] aminopropyltrimethoxysilane, 3-(N-anil-N-glycidyl)aminopropyltrimethoxysilane, 3-(N-anil-N-methacryloyl)aminopropyltrimethoxysilane, 3-glycidyloxypropylmethylethoxysilane, N,N-bis-[3-(trimethoxycinyl)propyl]methacrylamide, γ-glycidoxytrimethyldimethoxysilane, 3-glycidyloxypropyltrimethoxysilane, 3-glycidyloxypropyltriethoxysilane, 3-glycidyloxypropylmethylmethoxysilane, beta(3,4-epoxycyclohexyl)ethyltrimethoxysilane, 3-methacryloxypropyltrimethoxysilane, 3-glycidyloxypropylmethyldimethoxysilane, heptadecafluorodecyltrimethoxysilane, 3-methacryloxypropylmethyldimethoxysilane, 3-methacryloxypropyltris(trimethylsiloxy)silane, methyltris(dimethylsiloxy)silane, 3-aminopropyltriepoxysilane, 3-mercaptopropyltrimethoxysilane, and N-((3-aminoethyl)-γ-aminopropyltrimethoxysilane.

In addition, the physical property-improving component may be included in an amount of 0.5-20 parts by weight with respect to 100 parts by weight of the main resin. When the physical property-improving component is included in an amount less than 0.5 parts by weight, desired physical properties such as improvement of heat radiation performance and adhesion may not be achieved concurrently to a desired level through the physical property-improving component. Furthermore, when the physical property-improving component is included in an amount exceeding 20 parts by weight, an adhesive force of the physical property-improving component to a surface to be coated may be weakened.

On the other hand, the above-described insulating heat radiation coating composition may further include a colorant for minimizing a loss of color due to light, air, moisture, or extreme temperature or for exhibiting a desired certain color and may include a quencher for eliminating gloss so as to exhibit stability of a coating film surface.

The colorant may be a known pigment, coloring, or the like. Specifically describing the pigment, in an example, the pigment may be an organic pigment and/or an inorganic pigment. Examples of the inorganic pigment may include chromates such as chrome, molybdate, and zinc chromate; oxides such as titanium dioxide, iron oxide, zinc oxide, and chromium oxide; hydroxides such as iron oxide yellow and aluminate white; and other inorganic pigments such as iron blue and carbon black. The organic pigment may be broadly classified into an azo pigment mainly including yellowish to reddish pigments and a phthalocyanine pigment mainly including bluish to greenish pigments. In addition, examples of the organic pigment may include a metal complex salt pigment, a condensed polycyclic pigment such as an anthraquinone, thioindigo, perinone, perylene, quinacridone, dioxazine, quinophthalone, or isoindolinone pigment, a nitro pigment, a nitroso pigment, and other pigments such as alkali blue and aniline black. A content of the pigment may be appropriately adjusted in consideration of a specific type of a pigment according to a color to be implemented and a degree of the color. In an example, the pigment may be included in an amount of 10-60 parts by weight, and preferably, in an amount of 35-55 parts by weight with respect to 100 parts by weight of the main resin, but the present invention is not limited thereto.

In addition, the quencher may include at least one selected from the group consisting of titanium dioxide, aerogel silica, hydrogel silica, polypropylene wax (PP wax), polyethylene wax (PE wax), polytetrafluoroethylene wax (PTFE wax), a urea formaldehyde resin, and a benzoguanamine formaldehyde resin, and preferably, may include titanium dioxide. In addition, the quencher may be included in an amount of 30-60 parts by weight and, preferably, in an amount of 35-55 parts by weight with respect to 100 parts by weight of the main resin, but the present invention is not limited thereto.

Talc usable as the colorant and titanium dioxide usable as the quencher may also be used as a filler together with the insulating heat radiation filler to improve a withstand voltage property.

Meanwhile, the above-described insulating heat radiation coating composition may further include a flame retardant to improve flame retardancy of the insulating heat radiation coating layer.

The flame retardant may include a known component used as a flame retardant in the art. In an example, the flame retardant may include at least one selected from the group consisting of trizinc bis(orthophosphate), tryphenyl phosphate, trixylenyl phosphate, tricresyl phosphate, triisophenyl phosphate, tris-chloroethyl phosphate, tris-chloropropyl phosphate, resorcinol di-phosphate, aromatic polyphosphate, polyphosphoric acid ammonium, and red phosphorous. In addition, the flame retardant may be included in an amount of 10-35 parts by weight, and preferably, in an amount of 15-30 parts by weight with respect to 100 parts by weight of the main resin.

Meanwhile, the above-described insulating heat radiation coating composition may further include a dispersant and a solvent, which are used to improve dispersibility of an insulating heat radiation filler and implement a uniform insulating heat radiation coating layer.

The dispersant may include a known component used as a dispersant of an insulating heat radiation filler in the art. In an example, the dispersant may include at least one selected from a silicon-based dispersant, a polyester-based dispersant, a polyphenylene ether-based dispersant, a polyolefin-based dispersant, an acrylonitrile-butadiene-styrene copolymer dispersant, a polyarylate-based dispersant, a polyamide-based dispersant, a polyamide imide-based dispersant, a polyaryl sulfone-based dispersant, a polyether imide-based dispersant, a polyether sulfone-based dispersant, a polyphenylene sulfide-based dispersant, a polyimide-based dispersant, a polyether ketone-based dispersant, a poly benzoxazol-based dispersant, a poly oxadiazole-based dispersant, a poly benzothiazole-based dispersant, a poly benzimidazole-based dispersant, a polypyridine-based dispersant, a polytriazole-based dispersant, a polypyrrolidine-based dispersant, a poly dibenzofuran-based dispersant, a polysulfone-based dispersant, a polyurea-based dispersant, a polyurethane-based dispersant, a polyphosphazene-based dispersant, and the like.

These may be used alone or in the form of a mixture or copolymer of two or more selected therefrom. Furthermore, in an example, the dispersant may be a silicon-based dispersant.

In addition, the dispersant may be included in an amount of 0.5-20 parts by weight with respect to 100 parts by weight of the insulating heat radiation filler. When the dispersant is included in an amount less than 0.5 parts by weight with respect to 100 parts by weight of the insulating heat radiation filler, a desired effect may not be exhibited. When the dispersant is included in an amount exceeding 20 parts by weight, adhesive strength of an adherend may be weakened, or pin holes and orange peels may occur on a coating film surface.

In addition, the solvent may be appropriately selected according to a selected main resin, curing agent, or the like, but the present disclosure is not particularly limited thereto. The solvent may include any solvent capable of appropriately dissolving each component. For example, the solvent may include at least one selected from the group consisting of an aqueous solvent such as water, an alcohol-based solvent, a ketone-based solvent, an amine-based solvent, an ester-based solvent, an amide-based solvent, a halogenated hydrocarbon-based solvent, an ether-based solvent, and a furan-based solvent.

Furthermore, the above-described insulating heat radiation coating composition may further include an ultraviolet (UV) stabilizer for preventing yellowing by a UV ray.

The UV stabilizer may include a known component used as a UV stabilizer of an insulating heat radiation coating composition in the art. In an example, the UV stabilizer may include at least one selected from the group consisting of 2-(2'-hydroxy-3,5'-di(1,1-dimethylbenzyl-phenyl)-benzotriazole, 2-(2'-hydroxy-3',5'-di-tert-butylphenyl)-benzotriazole, 2-(2'-hydroxy-3'-tert-butyl-5'-methylphenyl)-5-chlorobenzotriazole, 2-(2-hydroxy-5-tert-octylphenyl)-benzotriazole, 2-(5-methyl-2-hydroxyphenyl)-benzotriazole, 2,6-di-t-butyl-4-methylphenol, tetrakis[methylene-3(3,5-di-t-butyl-4-hydroxyphenyl)propionate]methane, octadecyl-3,5-di-t-butyl-4-hydroxyhydrocinnamate, 2,2'-methylenebis(4-methyl-6-t-butylphenol), tris(2,4-di-t-butylphenyl)-phosphite, bis(2,4-di-t-butyl), pentaerythritol-di-phosphite alkyl ester phosphite, dilauryl thio-di-propionate, distearyl thio-di-propionate, and dimyristyl thio-di-propionate. In addition, in an example, the UV stabilizer may be 2-(2'-hydroxy-3,5'-di(1,1-dimethylbenzyl-phenyl)-benzotriazole.

In addition, the UV stabilizer may be further included in an amount of 0.05-2 parts by weight with respect to 100 parts by weight of the main resin. When the UV stabilizer is included in an amount less than 0.05 parts by weight with respect to 100 parts by weight of the main resin, a desired effect may not be exhibited. When the UV stabilizer is included in an amount exceeding 2 parts by weight, adhesive strength and impact resistance of an insulating heat radiation layer may be decreased.

Furthermore, the above-described insulating heat radiation coating composition may further include an antioxidant for preventing discoloration of a coating dry film, embrittlement due to oxidation, and a reduction in physical properties such as adhesive strength.

The antioxidant may include a known component used as an antioxidant of an insulating heat radiation coating composition in the art. In an example, the antioxidant may include at least one selected from the group consisting of trimethyl phosphate, triphenyl phosphate, tris(2,4-di-tert-butylphenyl)phosphate, triethylene glycol-bis-3-(3-tert-butyl-4-hydroxy-5-methylphenyl)propionate, 1,6-hexanediol[3-(3,5-di-tert-butyl-4-hydroxyphenyl)propionate], pentaerythritol-tetrakis(3-(3,5-di-tert-butyl-4-hydroxyphenyl)propionate, 2-hydroxybenzophenone, 2-hydroxyphenyl benzothiazole, a hindered amine, an organic nickel compound, a salicylic acid salt, a cinnamate derivative, resorcinol monobenzoate, oxanilide, and p-hydroxybenzoate. In addition, in an example, the antioxidant may be 2-hydroxyphenyl benzothiazole.

Furthermore, the antioxidant may be further included in an amount of 0.1-3 parts by weight with respect to 100 parts by weight of the main resin. When the antioxidant is included in an amount less than 0.1 parts by weight with respect to 100 parts by weight of the main resin, discoloration may occur. When the antioxidant is included in an amount exceeding 3 parts by weight, brittleness may be increased, and adhesive strength may be decreased.

In addition, the above-described insulating heat radiation coating composition may include at least one type selected from various additives such as a leveling agent, a pH adjusting agent, an ion trapping agent, a viscosity modifier, a thixotropic agent, a heat stabilizer, a photostabilizer, an ultraviolet absorber, a dehydrating agent, an antistatic agent, an antifungal agent, and a preservative. The above-described various additives may be those well known in the art and are not particularly limited in the present invention.

The above-described insulating heat radiation composition according to the exemplary embodiment of the present invention may have a viscosity of 5 cps to 600 cps at a temperature of 25° C. When the viscosity of the insulating heat radiation composition is less than 5 cps, the formation of an insulating heat radiation coating layer may be difficult due to a downflow of the composition and even after the insulating heat radiation coating layer is formed, adhesive strength with respect to an outer surface of a bobbin may be decreased. When the viscosity of the insulating heat radiation composition exceeds 600 cps, it is difficult to prepare a thin insulating heat radiation coating layer and although the thin insulating heat radiation coating layer is prepared, a surface of the thin insulating heat radiation coating layer may not be uniform, and a coating process may not be easy. In particular, a coating process may be more difficult in the case of spray coating. Furthermore, dispersibility of an insulating heat radiation filler in the insulating heat radiation coating layer may be decreased.

Meanwhile, the insulating heat radiation coating composition according to the exemplary embodiment of the present invention may have a heat radiation efficiency of 10% or more by using a heat radiation evaluation method below.

Specifically, the heat radiation evaluation method is performed as follows: after a heat source having a surface area of 4 cm$^2$ and a temperature of 88° C. is placed to be in contact with a lower center of specimen which includes a 25-μm thick insulating heat radiation coating layer formed by treating an insulating heat radiation coating composition on an upper surface of an aluminum plate having a thickness of 1.5 mm and a width of 35 mm×34 mm in a closed system having a temperature of 25° C. and a humidity of 50%, a temperature is measured at an upper point located 5 cm from a center of specimen, temperature is measured in the same manner solely on an aluminum plate on which a heat radiation coating layer is not formed, and a heat radiation efficiency is measured according to the following Expression 1. In this case, the closed system may be a 32-by-30-by-30-cm acrylic chamber, and specimen may be placed at a center of the closed system. In addition, a temperature of the heat source may be adjusted to a certain temperature. A heat source may be used without limitation as long as it is capable of maintaining the certain temperature. In an example, the heat source may be a light-emitting diode (LED) having a certain power consumption.

$$\text{heat radiation efficiency (\%)} = \{(\text{temperature (° C.) of upper point located 5 cm from center of specimen 1})/(\text{temperature (° C.) of upper located point 5 cm from center of specimen 2})-1\} \times 100 \quad \text{[Expression 1]}$$

High heat radiation efficiency calculated according to Expression 1 may mean that heat a heat radiation property is excellent and thus heat is rapidly radiated into air. Since heat radiation efficiency of the insulating heat radiation coating composition according to the exemplary embodiment of the present invention, which is calculated according to Expression 1, is 10% or more, and preferably, 80% or more, it can be confirmed that the insulating heat radiation coating composition has very excellent heat radiation efficiency.

The insulating heat radiation coating layer may include the insulating heat radiation filler 104b in an amount of 10 wt % or more with respect to the total weight thereof, but the present invention is not limited thereto. The amount of the insulating heat radiation filler 104b may be changed in consideration of degrees of a desired heat radiation property and an insulating property.

On the other hand, since the above-described heat radiation member exhibits quite excellent heat conduction performance and radiation performance, the heat radiation member may be easily applied as a bobbin for a coil component. Heat generated by the coil component may be rapidly conducted and radiated to the outside through the bobbin, thereby preventing a reduction in physical properties of the coil component. In addition, an insulating film may be further provided on an outer surface of the heat radiation member, thereby preventing a short circuit due to a current applied to a pair of coils to be wound. Alternatively, an insulating heat radiation coating layer may be further provided on the outer surface of the heat radiation member and thus may exhibit more improved heat radiation performance together with the heat radiation member and concurrently exhibit an insulating property. The shape and size of the bobbin for the coil component may be a known shape and size, and thus, the present invention is not particularly limited thereto.

Next, the magnetic core 10 accommodated in the upper bobbin 100A and the lower bobbin 100B described above may be made of at least one magnetic material selected from the group consisting of an amorphous soft magnetic alloy, a soft magnetic alloy containing crystal grains, ferrite, a silicon steel sheet, a sendust, and a permalloy. The amorphous soft magnetic alloy may be an alloy in which elements such as Si, B, C, and P having a glass-forming ability are added to transition metals such as Fe, Ni, and Co. A known amorphous soft magnetic alloy may be used without limitation. In an example, the amorphous soft magnetic alloy may be an Fe—Si—B-based alloy, a Fe—Si—B—Cr-based alloy, a Co—Si—B-based alloy, a Co—Zr-based alloy, a Co—Nb-based alloy, a Co—Ta-based alloy, or the like. In addition, the soft magnetic alloy containing the crystal grains may be a known crystalline soft magnetic alloy. In an example, the crystalline soft magnetic alloy may be an Fe-based alloy, a Co-based alloy, a Ni-based alloy, an Fe—Ni-based alloy, an Fe—Co-based alloy, an Fe—Al-based alloy, an Fe—Si-based alloy, an Fe—Si—Al-based alloy, or an Fe—Ni—Si—Al-based alloy. On the other hand, after an amorphous parent alloy is prepared, the above-described amorphous alloy may partially or entirely include crystal grains through an additional heat treatment. Thus, even though the above-described amorphous alloy has an amorphous composition, the amorphous alloy may include the crystal grains. In addition, the ferrite may be a known ferrite. In an example, the ferrite may include at least one selected from the group consisting of Mn—Zn-based ferrite, Ni—Zn-based-ferrite, Ni—Co-based ferrite, Mg—Zn-based ferrite, Cu—Zn-based ferrite, and cobalt substituted Y-type or Z-type hexagonal ferrite. In this case, the ferrite may include ferrite, i.e., Ni—Cu—Zn-based ferrite or Ni—Cu—Co—Zn-based ferrite, containing iron oxide and at least three oxides of metals selected from the group consisting of nickel, zinc, copper, magnesium, and cobalt, but the present invention is not limited thereto. Here, contents of nickel, zinc, copper, magnesium, and cobalt in the ferrite may be changed according to purpose, and thus, the present invention is not particularly limited thereto.

In addition, the silicon steel sheet, the permalloy, and the sendust may have a conventionally known composition, a specific composition ratio of each composition may be changed according to purpose, and the present invention is not particularly limited thereto.

The magnetic core 10 may be a powder magnetic core in which powder obtained by ball-milling a mother alloy formed into powder or in which a mother alloy formed into a ribbon is mixed with a binder and molded into a desired shape, a wound magnetic core manufactured by winding an alloy formed into a thin band or a plate shape, or a stacked magnetic core manufactured by stacking an alloy formed into a thin band or a plate shape. In this case, a specific method of manufacturing the powder magnetic core, the wound magnetic core, and the stacked magnetic core may be a known method, and thus, the present invention is not limited thereto. The shape of the magnetic core 10 may be changed according to a purpose thereof, and the magnetic core 10 may have a through-hole at a center thereof as shown in FIG. 2B.

In addition, the size of the magnetic core 10 may be changed according to an application body or the like using the coil component, and thus, the present invention is not particularly limited thereto.

On the other hand, when the magnetic core 10 is accommodated in an interior space of the bobbin 100, it may not be easy for an inner surface of the bobbin 100 and an outer surface of the magnetic core 10 to be perfectly fitted to each other and to form interfaces which are in close contact with each other without an air layer. In this case, even if the bobbin 100 is a heat radiation member, heat generated in the magnetic core may not be removed rapidly to the outside. Accordingly, a thermal interface material (TIM) may be further provided in the interior space of the bobbin 100, in which the magnetic core 10 is accommodated. The TIM may be a known material. In an example, the TIM may be a heat radiation filler including heat radiation grease, a thermally conductive phase change material, or a heat radiation filler, but the TIM is not limited thereto.

Next, the coil 200 may be formed by winding conductive wires on an outer surface of the bobbin 100. In this case, at least two wires 201 and 202 may be wound so as to be spaced apart from each other. Specifically, as shown in FIG. 1, when the bobbin 100 is divided in half, wires may be wound in divided regions to form a pair of coils 200.

The coil 200 may include any material without limitation as long as the material is commonly used in a coil component. In an example, the coil 200 may include metals having excellent conductivity, such as Ag, Pd, Cu, Al, and alloys thereof. A diameter of the coil 200 may be selected according to a size of a common module coil component according to the application, and thus, the present invention is not particularly limited thereto. In addition, the number of turns of the coil 200 wound outside the bobbin may be designed differently according to a desired degree of physical properties, and thus, the present invention is not particularly limited thereto. In an example, one coil may be wound 2 times to 500 times.

Figure 3A:
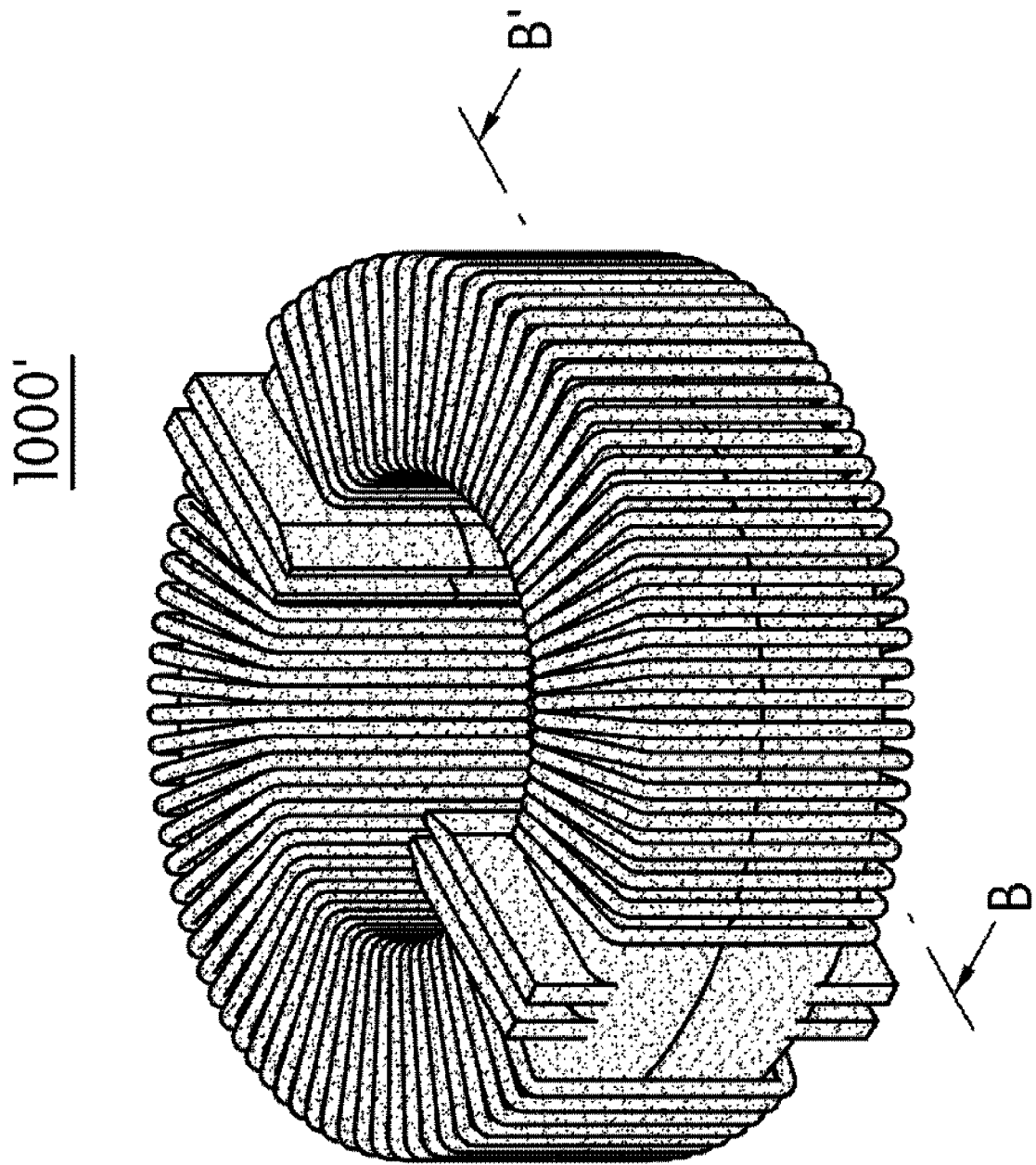
FIG. 3A is a perspective view illustrating the coil component.
Figure 3B:
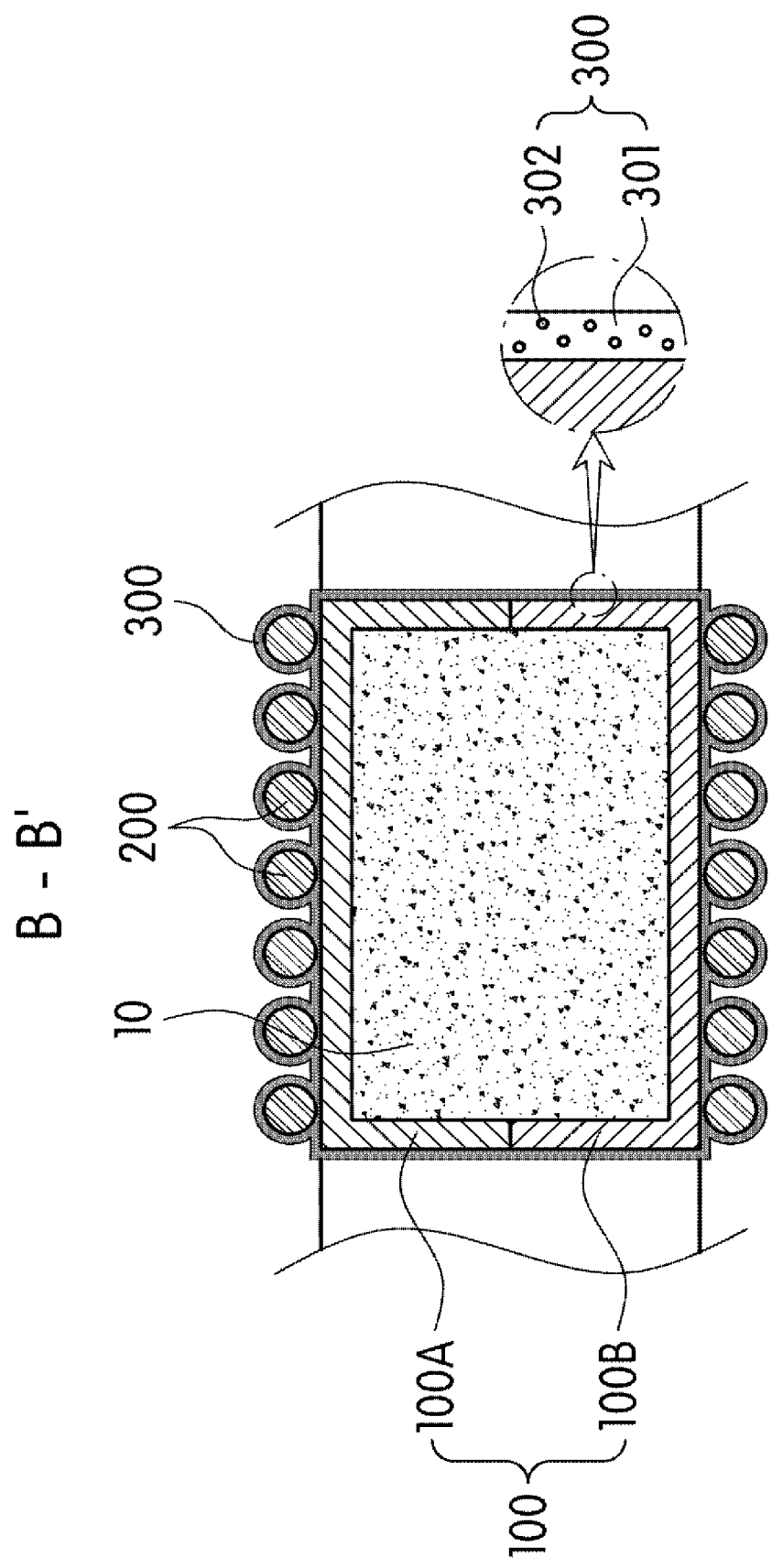
FIG. 3B is a cross-sectional view taken along boundary line B-B' and is an enlarged view of the cross-sectional view.

Meanwhile, as shown in FIGS. 3A and 3B, a coil component 1000' according to an exemplary embodiment of the present invention may further include an insulating heat radiation coating layer 300 coated on outer surfaces of the above-described bobbins 100A and 100B, i.e., the heat radiation member and an outer surface of the coil component including the coil 200 wound outside the bobbins 100A and 100B. When the insulating heat radiation coating layer 300 is additionally provided, the insulating heat radiation coating layer 300 may exhibit more improved heat radiation performance together with the bobbins 100A and 100B, i.e., the heat radiation member, and may prevent a reduction in function of the coil component due to overheating. Since the insulating heat radiation coating layer 300 is the same as that described above, detailed descriptions thereof will be omitted.

Figure 4A:
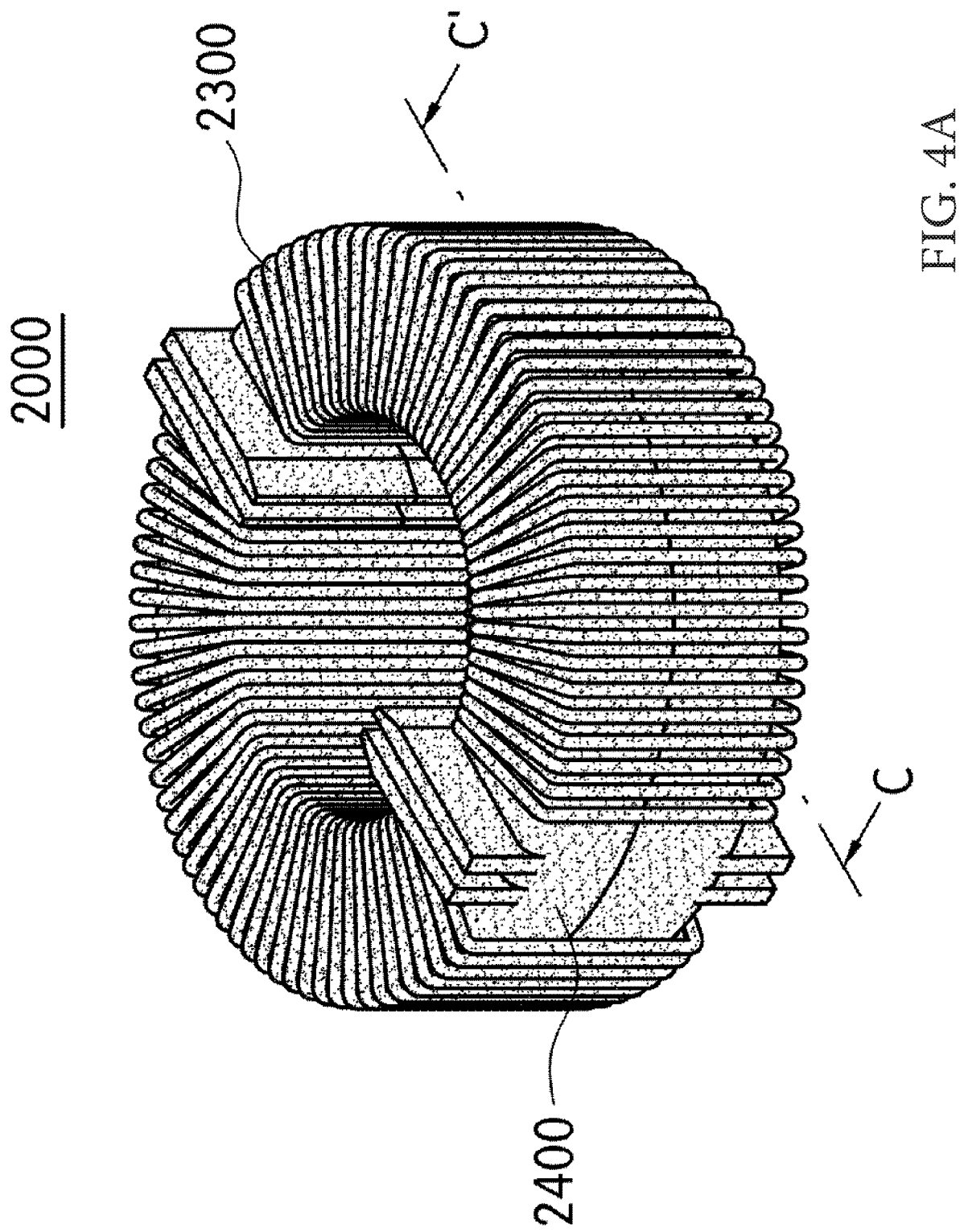
FIG. 4A is a perspective view illustrating the coil component.
Figure 4B:
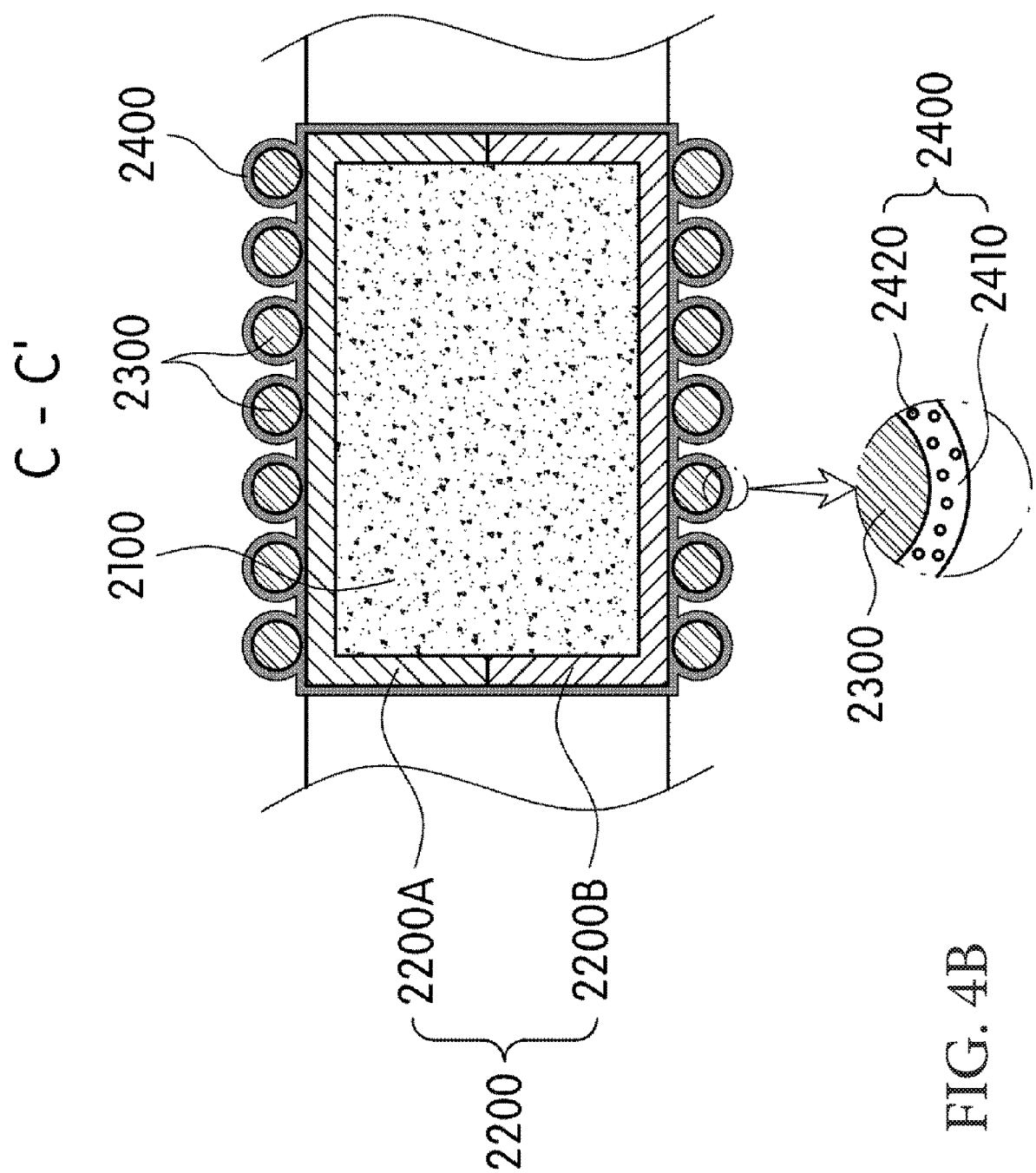
FIG. 4B is a cross-sectional view taken along boundary line C-C' and is an enlarged view of the cross-sectional view.

In addition, as shown in FIGS. 4A and 4B, a coil component 2000 according to another exemplary embodiment of the present invention includes a heat radiation coating layer 2400 coated on an outer surface of a bobbin 2200 in which an upper bobbin 2200A and a lower bobbin 2200b accommodate a magnetic core 200 and are integrally coupled, and an outer surface of the coil component 2000 including a coil 2300 wound outside the bobbin 2200.

The magnetic core and the coil are the same as those described above, and the difference from the coil components 1000 and 1000' will be mainly described. The bobbin 2200 may include a material used in a common coil component and may include any material without limitation as long as the material exhibits an insulating property. However, since the bobbin 2200 made of a general material does not have good thermal conductivity and heat radiation performance, the bobbin 2200 may include an insulating heat radiation coating layer (not shown) coated on an outer surface thereof.

In addition, the coil component 2000 includes an insulating heat radiation coating layer 2400 coated on the bobbin 2200 and the coil 2300 wound outside the bobbin 2200. Improved heat radiation performance may be exhibited due to the heat radiation coating layer 2400. The insulating heat radiation coating layer 2400 may include a coating layer 2410 and an insulating heat radiation filler 2420 dispersed in the coating layer 2410. Since the material, content, and formation method thereof are the same as those described above, detailed descriptions thereof will be omitted.

In addition, a TIM may be further provided in an empty space between an interior surface of the bobbin 2200 and the magnetic core 2100 accommodated in the bobbin 2200.

Figure 5A:
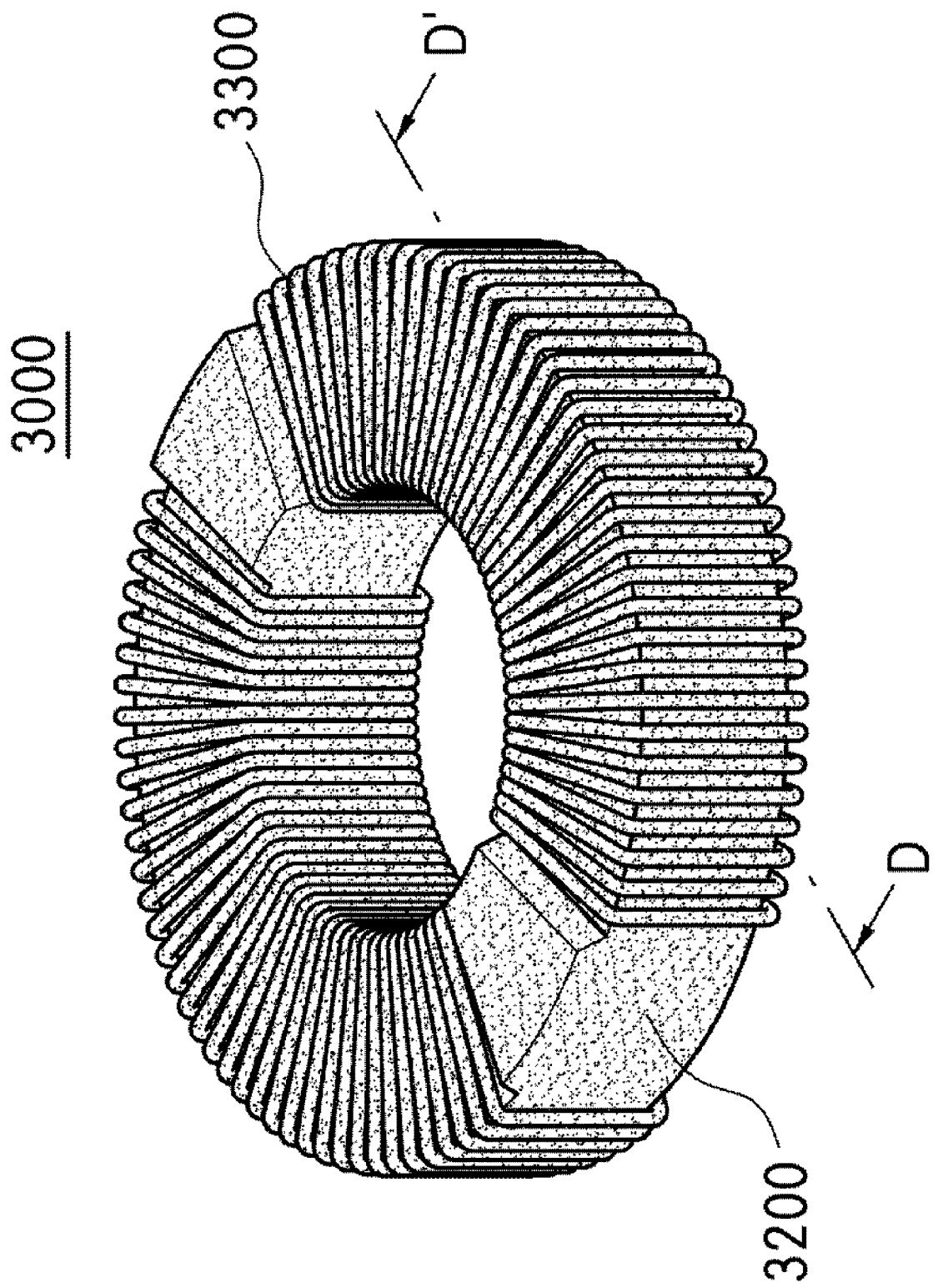
FIG. 5A is a perspective view illustrating the coil component.
Figure 5B:
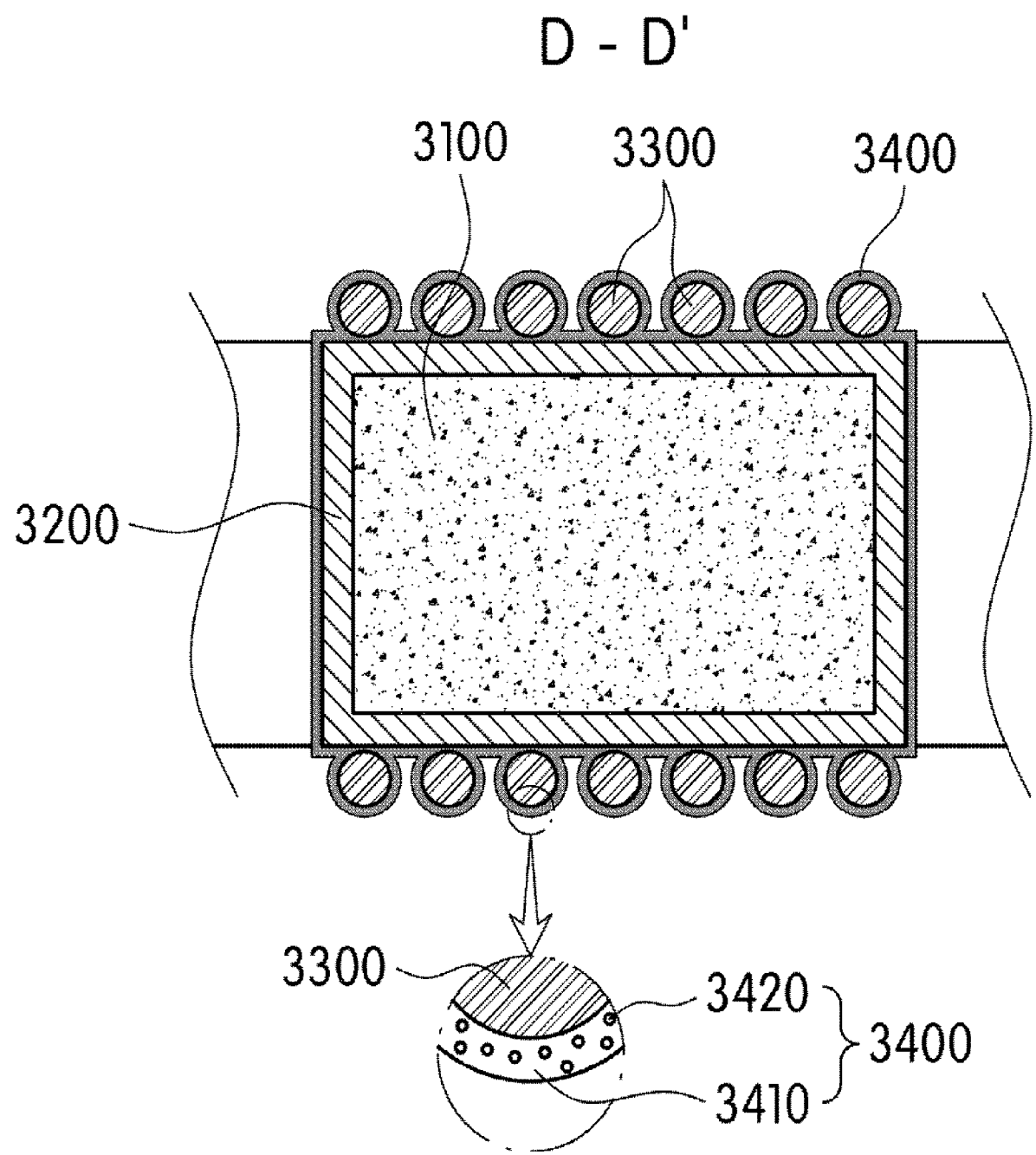
FIG. 5B is a cross-sectional view taken along boundary line D-D' and is an enlarged view of the cross-sectional view.
Figure 6:
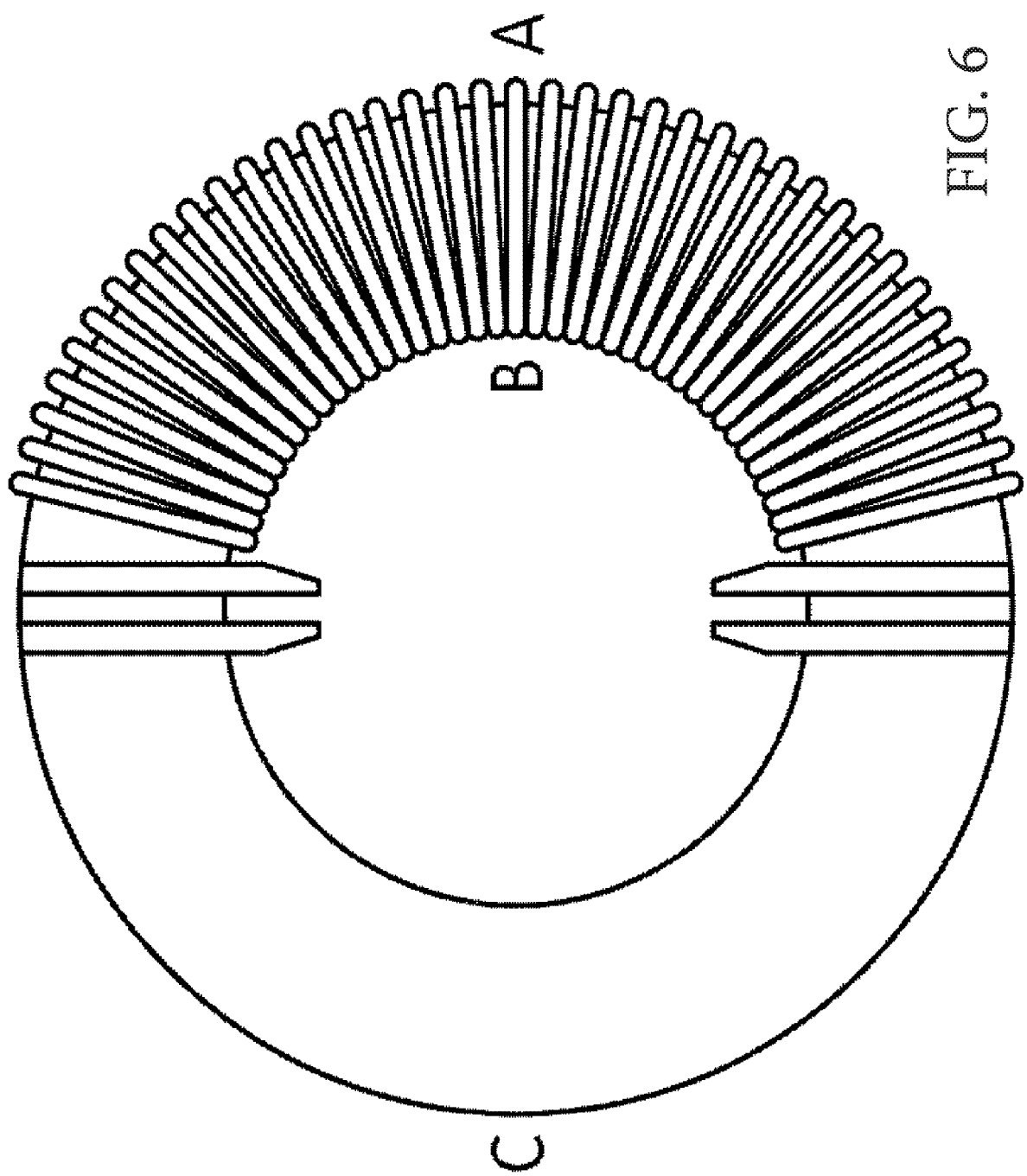
FIG. 6 is a schematic view illustrating a specimen for a heat radiation experiment according to an exemplary embodiment of the present invention.
Figure 7A:
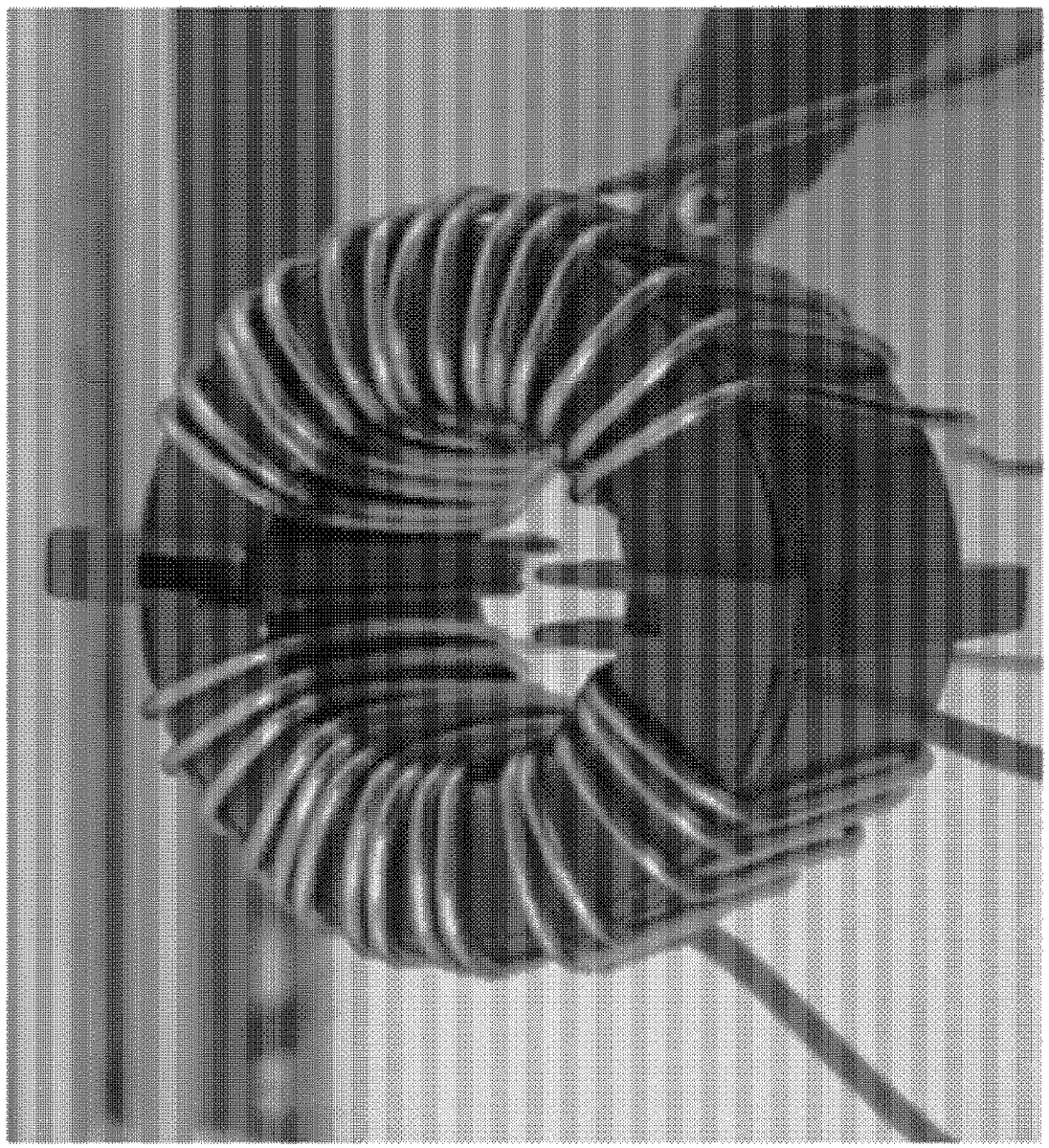
FIG. 7A is an image showing a coil component implemented using a bobbin, i.e., a heat radiation member.
Figure 7B:
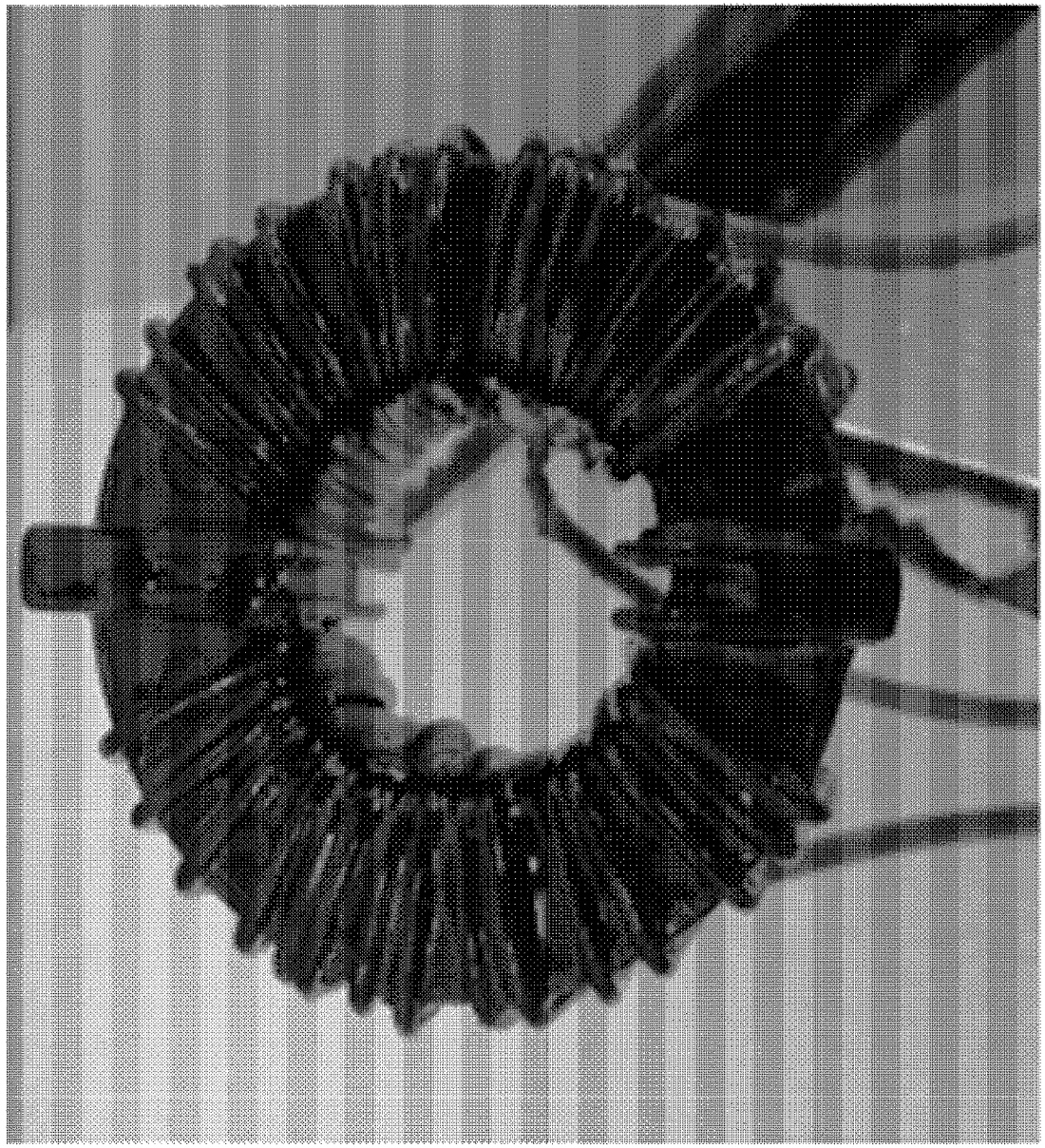
FIG. 7B is an image showing a bobbin for a coil component using the bobbin, i.e., a heat radiation member, and showing the coil component including an insulating heat radiation coating layer coated on a coil wound on the bobbin.

In addition, as shown in FIGS. 5A and 5B, a coil component 3000 according to another exemplary embodiment of the present invention includes a magnetic core 3100, an insulating film covering the magnetic core 3100, and at least one pair of coils 3300 wound outside the insulating film 3200. The coil component 3000 includes an insulating heat radiation coating layer 3400 coated on an outer surface of the insulating film 3200 and an outer surface of the coil component including the coils wound 3300 outside the insulating film 3200.

Describing the difference from the above-described coil components 1000, 1000', and 2000, the coil component 3000 according to FIGS. 5A and 5B does not include a bobbin and includes the insulating film 3200 directly coated on an outer surface of the magnetic core 3100. The insulating film 3200 may include at least one polymer component selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a methacrylic-based resin, polyamide, polyester, polycarbonate, polyphenylene sulfide, polyamideimide, polyvinyl butyral, polyvinyl formal, polyhydroxy polyether, polyether, polypthalamide, a phenoxy resin, polyurethane, a nitrile butadiene resin, a urea-based resin (UF), a melamine-based resin (MF), an unsaturated polyester resin (UP), an epoxy resin, and a silicon resin. The insulating film 3200 may be formed by melting and then solidifying the at least one polymer component through cooling or curing. The insulating film 3200 may be coated through a specific formation method, i.e., a known coating method, such as dip coating, comma coater, or spraying, which is selected according to a type of a selected polymer component. The insulating film 3200 may be formed to have a thickness of 0.1 mm to 100 mm, but the present invention is not limited thereto. The insulating film 3200 may further include the above-described insulating heat radiation filler to radiate heat generated in the magnetic core more efficiently. In this case, the insulating film including the insulating heat radiation filler may be the same as the above-described insulating heat radiation coating layer.

In addition, the present invention may be widely applied in various electronic components such as a transformer, an electromagnetic interference (EMI) filter, a power factor correction (PFC) circuit, and a current sensor, electronic devices, and vehicles, which include the above-described coil components 1000, 1000', 2000, and 3000. The electronic components, the electronic devices, the vehicles, and the like may further include a known component in addition to the above-described coil components.

MODE OF THE INVENTION

Hereinafter, the present invention will be described in more detail through the following examples. It will be obvious to a person having ordinary skill in the art that these examples are for illustrative purposes only and are not to be construed to limit the scope of the present invention.

Example 1

Graphite and a nickel (Ni) powder were mixed in a weight ratio of 3:2 for 10 minutes by using a mixer to prepare a raw powder, and 30 lpm of an argon gas as a central gas and 50 lpm of an argon gas as a sheath gas were injected into a high frequency thermal plasma device. Afterward, high temperature thermal plasma was generated by applying 17 kW using a plasma torch power source, and then, a degree of vacuum of the device was maintained to be 500 Torr before the raw powder was injected. The raw powder mixed with graphite was injected into a high frequency thermal plasma reacting portion through a jet nozzle of a plasma generating electrode portion. Only the Ni powder was crystallized into nanopowder through a selective evaporation process, thereby preparing a graphite-nano metal composite bonded to a surface of graphite.

Thereafter, 0.5 mM of a dopamine monomer was dissolved in 100 mM of a tris buffer solution (TBS), and 5 g of the graphite-nano metal composite was mixed in 1 L of the resultant solution and was stirred at room temperature for 2 hours in an atmospheric state. Then, in order to increase a reaction rate between dopamine and Ni on the graphite-nano metal composite, an oxidant as a catalyst was added in an amount of 10 parts by weight with respect to 100 parts by weight of the dopamine monomer, and the resultant solution was stirred.

After the stirring was performed for 2 hours, the stirred solution was filtered to remove unreacted substances and was washed twice with deionized (DI) water and then dried at room temperature to prepare a graphite-nano metal composite on which a dopamine layer is formed.

Then, 46 parts by weight of the prepared graphite-nano metal composite and 7.7 parts by weight of glass fiber as a strength enhancer were mixed with respect to 100 parts by weight of polyamide 6, were injected into a main hopper and a site feeder of a co-rotating twin-screw extruder and then melted and extruded to prepare pellets under a temperature condition of 280° C. The prepared pellets were dried in a heated-air drier and then injection-molded into a shape of a bobbin 100 of FIG. 2A to prepare a bobbin.

In order to improve a heat radiation property of the prepared bobbin, a heat radiation coating composition prepared in Preparation Example 1 was cured on an entire outer surface of the bobbin, spray-coated to have a final thickness of 25 μm, and then, heat-treated at a temperature of 150° C. for 10 minutes to form an insulating heat radiation coating layer.

Then, a donut-shaped magnetic core made of Mn—Zn-based ferrite was assembled into an accommodation space inside the bobbin as shown in FIG. 2B, and two strands of copper wires were wound on an outer surface of the bobbin so as to not be in contact with each other, thereby manufacturing a coil component as shown in FIG. 1.

Preparation Example 1

A coating layer-forming component was prepared as follows: 60 parts by weight of a curing agent including a polyethylene polyamine as a first curing agent and 2,4,6-tris[N,N-dimethylaminolmethyl]phenol as a second curing agent in a weight ratio of 1:1, 47 parts by weight of silicon carbide having an average particle diameter of 5 μm and a D50 to D97 ratio of 1:1.6, 3 parts by weight of an epoxy-based silane compound as a physical property-improving component (Tech-7130 manufactured by Shanghai Tech Polymer Technology), 44 parts by weight of talc as a colorant, 44 parts by weight of titanium dioxide as a quencher, 22 parts by weight of trizinc bis(orthophosphate) as a flame retardant, 0.5 parts by weight of 2-(2'-hydroxy-3,5'-di(1,1-dimethylbenzyl-phenyl)-benzotriazole as a UV stabilizer, 1 part by weight of 2-hydroxyphenyl benzothiazole as an antioxidant, 5 parts by weight of a condensate of isobutylaldehyde and urea as a dispersant, and solvents, i.e., 13 parts by weight of 1-butanol, 13 parts by weight of n-butyl acetate, 13 parts by weight of 2-methoxy-1-methylethyl acetate, 9 parts by weight of methyl ethyl ketone, 37 parts by weight of ethyl acetate, 9 parts by weight of toluene, 43 parts by weight of 4-methyl-2-pentanone, and 103 parts by weight of xylene were mixed and stirred with respect to 100 parts by weight of a main resin, i.e., a compound represented by Formula 1 below. After the stirring, bubbles included in the resultant mixture were removed, and final viscosity was adjusted to 100 cps to 130 cps at a temperature of 25° C. to prepare the insulating heat radiation coating composition as shown in Table 1 below. Then, the insulating heat radiation coating composition was stored at a temperature of 5° C.

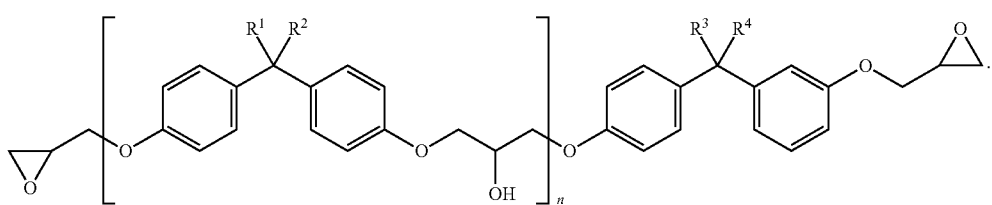

[Formula 1]

Each of $R^1$ to $R^4$ is a methyl group, and n is a rational number which allows a weight average molecular weight of the compound represented by Formula 1 to be 2,000.

Examples 2 to 24

Coil components as shown in Table 1, Table 2, Table 3, and Table 4 were manufactured in the same manner as in Example 1, except that insulating heat radiation coating compositions of Preparation Examples shown in Table 1, Table 2, Table 3, and Table 4 were used instead of the insulating heat radiation coating layer of Preparation Example 1.

Experimental Example 1

The heat radiation coating compositions (Preparation Examples 1 to 23 and Comparative Preparation Example 1) prepared in a manufacturing process of the Examples were spray-coated on an entire surface of a substrate made of an aluminum material (Al 1050) and having a thickness of 1.5 mm and an area of 35-by-34-mm so as to have a final thickness of 25 μm. Then, the spray-coated heat radiation coating compositions were heat-treated at a temperature of 150° C. for 10 minutes to prepare specimens on which an insulating heat radiation coating layer is formed. After that, the following physical properties of each of the specimens were evaluated and shown in Tables 1 to 4.

1. Evaluation of Thermal Conductivity

A specimen was placed at a center of a 32-by-30-by-30-cm acrylic chamber, and then, a temperature inside the chamber and a temperature of the specimen were adjusted to 25±0.2° C. Then, a 20-by-20-mm LED was attached to the specimen as a heat source by using a thermal conductive tape (TIM: 1 W/mk). Input power of 2.1 W (DC 3.9 V and 0.53 A) was applied to the heat source to generate heat. After the specimen was maintained for 90 minutes, a temperature of the specimen was measured to evaluate thermal conductivity. Specifically, thermal conductivity was calculated according to Expression 4 below based on a temperature measured with respect to an aluminum material substrate not including a heat radiation coating layer under the same conditions.

thermal conductivity (%)={1−(temperature (° C.) of test specimen)/(temperature (° C.) of uncoated substrate)}×100(%)   [Expression 2]

2. Evaluation of Heat Radiation Performance A specimen was placed at a center of a 32-by-30-by-30-cm acrylic chamber, and then, a temperature inside the chamber and a temperature of the specimen were adjusted to 25±0.2° C. Then, a 20-by-20-mm LED was attached to the specimen (specimen 1) as a heat source by using a thermal conductive tape (TIM: 1 W/mk). Input power of 2.1 W (DC 3.9 V and 0.53 A) was applied to the heat source and maintained. Then, after 90 minutes, a temperature of an upper point located 5 cm from a center of the specimen was measured, and after 90 minutes, a temperature of an aluminum material substrate (specimen 2) not including a heat radiation coating layer was measured in the same manner Heat radiation efficiency was calculated through Expression 1 below.

heat radiation efficiency (%)={(temperature (° C.) of upper point located 5 cm from center of specimen 1)/(temperature (° C.) of upper point located 5 cm from center of specimen 2)−1}×100   [Expression 1]

3. Uniformity Evaluation of Heat Radiation Performance Specimen was placed at a center of a 32-by-30-by-30-cm acrylic chamber, and a temperature inside the chamber and a temperature of specimen were adjusted to 25±0.2° C. Humidity inside the chamber was adjusted to 50%. Then, a 20-by-20-mm LED was attached to a specimen as a heat source by using a thermal conductive tape (TIM: 1 W/mk). Input power with 2.1 W (DC 3.9 V and 0.53 A) was applied to the heat source to generate heat. After the specimen was maintained for 90 minutes, temperature was measured at each of any of 10 points on a 15-mm radius circle centered on a center of an upper surface of the specimen, and an error of the temperature was calculated according to Expression 3. As an error becomes smaller, it can be considered that heat radiation performance is uniform, and it can be interpreted that dispersibility of a heat radiation filler of an insulating heat radiation coating layer is high. A maximum value of errors of a temperature was shown in Tables.

error (%) of temperature=[(average temperature (° C.) of any 10 points)−(temperature (° C.) of each point)]/(average temperature (° C.) of any 10 points)×100(%)   [Expression 3]

4. Evaluation of Durability

A specimen was placed in a chamber having a temperature of 60° C. and a relative humidity of 90%, and then, after 480 hours, a surface state of the specimen was visually evaluated. As a result of evaluation, the presence or absence of cracking and peeling (lifting) of an insulating heat radiation coating layer was confirmed. When there was no abnormality, it was indicated as O, and when there was an abnormality, it was indicated as X.

5. Evaluation of Adhesiveness

A specimen, on which durability was evaluated, was cross-cut at intervals of 1 mm by using a knife. After that, scotch tape was attached to a cut surface and was pulled at an angle of 60° to check a state in which an insulating heat radiation coating layer was peeled off. Evaluation was performed according to an evaluation criterion, i.e., ISO 2409. (5B: 0%, 4B: 5% or less, 3B: 5-15%, 2B: 15-35%, 1B: 35-65%, and 0B: 65% or more)

6. Evaluation of Surface Quality

In order to confirm a surface quality of a specimen, it was checked whether a surface was uneven or rough by touching the surface with a hand. When there was a smooth feeling, it was indicated as 5. When an area of a rough portion was less than 2% of the total area of an outer surface of specimen, it was denoted as 4. When the area of the rough portion was greater than 2% and 5% or less of the total area, it was denoted as 3. When the area of the rough portion was greater than 5% and 10% or less of the total area, it was denoted as 2. When the area of the rough portion was greater than 10% and 20% or less of the total area, it was denoted as 1. When the area of the rough portion was greater than 20% of the total area, it was denoted as 0.

TABLE 1

| | | | Preparation Example 1 | Preparation Example 2 | Preparation Example 3 | Preparation Example 4 | Preparation Example 5 | Preparation Example 6 | Preparation Example 7 |
|---|---|---|---|---|---|---|---|---|---|
| Coating layer-forming composition | Coating layer-forming component | Main resin (weight average molecular weight) | 2,000 | 2,000 | 2,000 | 310 | 570 | 3,900 | 4,650 |
| | | Content of curing agent (parts by weight) | 60 | 60 | 60 | 60 | 60 | 60 | 60 |
| | | Weight ratio of first curing agent and second curing agent | 1:1 | 1:1 | 1:1 | 1:1 | 1:1 | 1:1 | 1:1 |
| | Insulating heat radiation filler | Content (parts by weight) | 47 | 35 | 60 | 47 | 47 | 47 | 47 |
| | | Average particle diameter (μm) | 5 | 5 | 5 | 5 | 5 | 5 | 5 |
| | | Ratio of D50 to D97 | 1:1.6 | 1:1.6 | 1:1.6 | 1:1.6 | 1:1.6 | 1:1.6 | 1:1.6 |
| Heat radiation specimen | | Thickness (μm) of insulating heat radiation coating layer | 25 | 25 | 25 | 25 | 25 | 25 | 25 |
| | | Thermal conductivity (%) | 18.27 | 17.65 | 18.34 | 16.91 | 17.02 | 17.13 | 16.54 |
| | | Heat radiation efficiency (%) | 90 | 81 | 96 | 86 | 88 | 88 | 87 |
| | | Error (%) of temperature | 0.5 | 0.6 | 0.4 | 0.3 | 0.4 | 0.9 | 4.1 |
| | | Adhesiveness | 5B | 5B | 5B | 0B | 4B | 5B | 5B |
| | | Durability | o | o | o | x | o | o | o |
| | | Surface quality | 5 | 5 | 5 | 5 | 5 | 5 | 5 |

TABLE 2

| | | | Preparation Example 8 | Preparation Example 9 | Preparation Example 10 | Preparation Example 11 | Preparation Example 12 | Preparation Example 13 | Preparation Example 14 |
|---|---|---|---|---|---|---|---|---|---|
| Coating | Coating | Main resin | 2,000 | 2,000 | 2,000 | 2,000 | 2,000 | 2,000 | 2,000 |

TABLE 2-continued

|  |  |  | Preparation Example 8 | Preparation Example 9 | Preparation Example 10 | Preparation Example 11 | Preparation Example 12 | Preparation Example 13 | Preparation Example 14 |
|---|---|---|---|---|---|---|---|---|---|
| layer-forming composition | layer-forming component | (weight average molecular weight) | | | | | | | |
|  |  | Content of curing agent (parts by weight) | 15 | 30 | 95 | 110 | 60 | 60 | 60 |
|  |  | Weight ratio of first curing agent and second curing agent | 1:1 | 1:1 | 1:1 | 1:1 | 1:0.2 | 1:0.6 | 1:1.4 |
|  | Insulating heat radiation filler | Content (parts by weight) | 47 | 47 | 47 | 47 | 47 | 47 | 47 |
|  |  | Average particle diameter (μm) | 5 | 5 | 5 | 5 | 5 | 5 | 5 |
|  |  | Ratio of D50 to D97 | 1:1.6 | 1:1.6 | 1:1.6 | 1:1.6 | 1:1.6 | 1:1.6 | 1:1.6 |
| Heat radiation specimen |  | Thickness (μm) of insulating heat radiation coating layer | 25 | 25 | 25 | 25 | 25 | 25 | 25 |
|  |  | Thermal conductivity (%) | 16.22 | 17.39 | 17.12 | 14.59 | 16.94 | 17.72 | 17.63 |
|  |  | Heat radiation efficiency (%) | 88 | 88 | 87 | 87 | 86 | 88 | 89 |
|  |  | Error (%) of temperature | 0.5 | 0.5 | 0.5 | 0.5 | 0.4 | 0.5 | 0.5 |
|  |  | Adhesiveness | 0B | 4B | 4B | 2B | 0B | 5B | 5B |
|  |  | Durability | x | ○ | ○ | x | x | ○ | ○ |
|  |  | Surface quality | 2 | 5 | 5 | 1 | 5 | 5 | 5 |

TABLE 3

|  |  |  | Preparation Example 15 | Preparation Example 16 | Preparation Example 17 | Preparation Example 18 | Preparation Example 19 | Preparation Example 20 | Preparation Example 21 |
|---|---|---|---|---|---|---|---|---|---|
| Coating layer-forming composition | Coating layer-forming component | Main resin (weight average molecular weight) | 2,000 | 2,000 | 2,000 | 2,000 | 2,000 | 2,000 | 2,000 |
|  |  | Content of curing agent (parts by weight) | 60 | 60 | 60 | 60 | 60 | 60 | 60 |
|  |  | Weight ratio of first curing agent and second curing agent | 1:2 | 1:1 | 1:1 | 1:1 | 1:1 | 1:1 | 1:1 |
|  | Insulating heat radiation filler | Content (parts by weight) | 47 | 47 | 47 | 47 | 47 | 47 | 47 |
|  |  | Average particle diameter (μm) | 5 | 0.005 | 0.42 | 10 | 20 | 3 | 5 |
|  |  | Ratio of D50 to D97 | 1:1.6 | 1:2.41 | 1:2.08 | 1:1.51 | 1:1.93 | 1:3.08 | 1:4.96 |
| Heat radiation specimen |  | Thickness (μm) of insulating heat radiation coating layer | 25 | 25 | 25 | 25 | 25 | 25 | 25 |
|  |  | Thermal conductivity (%) | 17.01 | 12.11 | 17.63 | 17.92 | 17.19 | 17.88 | 18.31 |
|  |  | Heat radiation efficiency (%) | 88 | 7 | 88 | 91 | 90 | 81 | 39 |
|  |  | Error (%) of temperature | 0.5 | 0.5 | 0.5 | 0.4 | 2.8 | 0.8 | 3.9 |
|  |  | Adhesiveness | 2B | 3B | 5B | 5B | 3B | 4B | 2B |
|  |  | Durability | x | ○ | ○ | ○ | ○ | ○ | ○ |
|  |  | Surface quality | 5 | 5 | 5 | 4 | 0 | 4 | 3 |

TABLE 4

| | | | Preparation Example 22 | Preparation Example 23 | Comparative Preparation Example 1[1] |
|---|---|---|---|---|---|
| Coating layer-forming composition | Coating layer-forming component | Main resin (weight average molecular weight) | 2,000 | 2,000 | 2,000 |
| | | Content of curing agent(parts by weight) | 60 | 60 | 60 |
| | | Weight ratio of first curing agent and second curing agent | 1:1 | 1:1 | 1:1 |
| | Insulating heat radiation filler | Content (parts by weight) | 15 | 80 | — |
| | | Average particle diameter (μm) | 5 | 5 | — |
| | | Ratio of D50 to D97 | 1:1.6 | 1:1.6 | — |
| Heat radiation specimen | | Thickness (μm) of insulating heat radiation coating layer | 25 | 25 | 25 |
| | | Thermal conductivity (%) | 14.62 | 18.36 | 4.76 |
| | | Heat radiation efficiency (%) | 8 | 98 | 2 |
| | | Error (%) of temperature | 5.3 | 1.0 | 0 |
| | | Adhesiveness | 5B | 3.8 | 5B |
| | | Durability | ○ | x | ○ |
| | | Surface quality | 5 | 1 | 5 |

[1]Comparative Preparation Example 1 shows a composition which does not include a heat radiation filler.

As can be seen from Tables 1 to 4 above, it can be confirmed that Preparation Examples 1, 5, and 6, in which a weight average molecular weight of a main resin is within a preferred range of the present invention, concurrently achieve adhesiveness, durability, and uniformity of heat radiation performance as compared with Preparation Examples 4 and 7 which do not satisfy the preferred range.

In addition, it can be confirmed that Preparation Examples 1, 9, and 10, in which a content of a curing agent is within a preferred range of the present invention, concurrently achieve thermal conductivity, durability, and adhesiveness as compared with Preparation Examples 8 and 11 which do not satisfy the preferred range.

Furthermore, it can be confirmed that Preparation Examples 1, 13, and 14, in which a weight ratio of a first curing agent and a second curing agent is within a preferred range of the present invention, concurrently achieve adhesiveness and durability as compared with Preparation Examples 12 and 15 which do not satisfy the preferred range.

In addition, it can be confirmed that Preparation Examples 1, 17, and 18, in which an average particle diameter of an insulating heat radiation filler is within a preferred range of the present invention, concurrently achieve heat radiation efficiency, thermal conductivity, and surface quality as compared with Preparation Examples 16 and 19 which do not satisfy the preferred range.

Furthermore, it can be confirmed that Preparation Examples 1 and 20, in which a D50 to D97 ratio is within a preferred range of the present invention, concurrently achieves dispersibility, surface quality, heat radiation efficiency, and adhesiveness as compared with Preparation Example 21 which does not satisfy the preferred range.

In addition, it can be confirmed that Preparation Examples 1, 2, and 3, in which a content of a heat radiation filler is within a preferred range of the present invention, concurrently have considerably excellent heat radiation performance and surface quality as compared with Preparation Examples 22 and 23 which do not satisfy the preferred range.

Furthermore, it can be confirmed that Comparative Preparation Example 1 not including a heat radiation filler has considerably low heat radiation performance as compared with Preparation Example 1.

Experimental Example 2

Among the specimens prepared in Experimental Example 1, heat conductivity of each of the specimen according to Preparation Example 1 of Example 1 and the specimen according to Comparative Preparation Example 1 of Comparative Example 1 was measured through a steady state heat flow method, and a relative gain of the thermal conductivity was evaluated according to the following Expression 4. Evaluation results were shown in Table 5.

$$\text{relative gain (\%)} = \frac{(\text{thermal conductivity (Wm}^{-1}\text{K}^{-1}) \text{ of insulating heat radiation coating layer}) - (\text{thermal conductivity (Wm}^{-1}\text{K}^{-1}) \text{ of coating layer not including heat radiation filler})}{(\text{thermal conductivity (Wm}^{-1}\text{K}^{-1}) \text{ of coating layer not including heat radiation filler})} \times 100\%$$

[Expression 4]

TABLE 5

| Heat radiation coating composition | Preparation Example 1 | Comparative Preparation Example 1 |
|---|---|---|
| Thermal conductivity (W/m · K) of a speciman | 0.58 | 0.12 |
| Relative gain (%) of thermal conductivity | 383.3 | |

As can be seen from Table 5, it can be seen that Preparation Example 1 including an insulating heat radiation filler according to the present invention has considerably higher thermal conductivity as compared with Comparative Preparation Example 1 not including the insulating heat radiation filler and thus exhibits excellent heat radiation performance.

Experimental Example 3

Resistance value measurement was performed on bobbins on which an insulating heat radiation coating layer is formed and in which a copper coil is removed among the coil components manufactured according to Examples 1, 2, 3 and 23. Specifically, resistance values were measured through a four point probe method and were shown in Table 6 below.

TABLE 6

| Classification | Example 1 | Example 2 | Example 3 | Example 23 |
|---|---|---|---|---|
| Resistance value (Ω/sq.) | $1.3 \times 10^{12}$ | $7.1 \times 10^{13}$ | $9.7 \times 10^{10}$ | $7.1 \times 10^{9}$ |

As shown in Table 6, it can be seen that Examples 1 to 3 according to the present invention have a considerably higher resistance value as compared with Example 23 which includes somewhat more of an insulating heat radiation filler.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

The invention claimed is:

1. A coil component comprising:
a magnetic core; a bobbin configured to accommodate the magnetic core; and at least one pair of coils wound outside the bobbin,
wherein the bobbin is a heat radiation member which includes a polymer matrix and a plurality of graphite-nano metal composites which are dispersed on the polymer matrix, and each include nano metal particles bonded to a surface of graphite,
an insulating heat radiation coating layer formed of an insulating heat radiation coating composition on an outer surface of the bobbin,
wherein the insulating heat radiation coating layer is formed by treating an insulating heat radiation coating composition on the outer surface of the bobbin,
wherein the insulating heat radiation coating composition includes a coating layer-forming component including a main resin and an insulating heat radiation filler,
wherein the insulating heat radiation coating composition has a heat radiation efficiency of 30% or more according to a thermal radiation evaluation method below:
[Heat radiation evaluation method]
after a heat source having a surface area of 4 cm² and a temperature of 88° C. is placed to be in contact with a lower center of specimen 1 which includes a 25-μm thick insulating heat radiation coating layer formed by treating an insulating heat radiation coating composition on an upper surface of an aluminum plate having a thickness of 1.5 mm and an area of 35 mm×34 mm in a closed system having a temperature of 25° C. and a humidity of 50%, temperature is measured at an upper point located 5 cm from a center of a heat radiation unit, temperature is measured in the same manner solely on specimen 2, that is, an aluminum plate on which a heat radiation coating layer is not formed, and a heat radiation efficiency is measured according to Expression 1 below:

heat radiation efficiency (%)={(temperature (° C.) of upper point located 5 cm from center of specimen 1)/(temperature (° C.) of upper point located 5 cm from center of specimen 2)−1}× 100    [Expression 1].

2. The coil component of claim 1, wherein the nano metal particles are crystallized nanoparticles, and the graphite-nano metal composite further includes a polydopamine layer coated on the nano metal particles so as to improve an interfacial property between the polymer matrix and the graphite-nano metal composite.

3. The coil component of claim 1, wherein the graphite-nano metal composite is included in an amount of 10-95 wt % in the heat radiation member.

4. The coil component of claim 1, wherein the heat radiation member further includes an insulating film on an outer surface thereof that is made of at least one polymer component selected from the group consisting of polyethylene, polypropylene, polystyrene, polyvinyl chloride, a polyacrylonitrile resin, acrylonitrile-butadiene-styrene (ABS), styrene-acrylonitrile (SAN), an acrylic-based resin, a methacrylic-based resin, polyamide, polyester, polycarbonate, polyphenylene sulfide, polyamideimide, polyvinyl butyral, polyvinyl formal, polyhydroxy polyether, polyether, polypthalamide, a phenoxy resin, polyurethane, a nitrile butadiene resin, a urea-based resin (UF), a melamine-based resin (MF), an unsaturated polyester resin (UP), an epoxy resin, and a silicon resin.

5. The coil component of claim 1, wherein the insulating heat radiation coating layer is coated on the at least one pair of coils wound outside the bobbin.

6. The coil component of claim 1, further comprising a thermal interface material which fills an empty space in the bobbin accommodating the magnetic core.

7. The coil component of claim 1, wherein the main resin is a curable resin, and the coating layer-forming component further includes a curing agent included in an amount of 25-100 parts by weight with respect to 100 parts by weight of the main resin.

8. The coil component of claim 1, wherein the insulating heat radiation filler is included in an amount of 25-70 parts by weight with respect to 100 parts by weight of the main resin.

9. The coil component of claim 1, wherein the insulating heat radiation filler includes silicon carbide.

10. The coil component of claim 1, wherein the insulating heat radiation filler has an average particle diameter of 10 nm to 15 μm.

11. The coil component of claim 10, wherein a D50 to D97 ratio of the insulating heat radiation filler is less than or equal to 1:4.5, and wherein D50 and D97 are particle diameters of the insulating heat radiation filler when cumulative degrees in a volume accumulated particle size distribution are 50% and 97%, respectively.

12. A coil component comprising:
a magnetic core; a bobbin configured to accommodate the magnetic core; and at least one pair of coils wound outside the bobbin,
wherein the bobbin is a heat radiation member which includes a polymer matrix and a plurality of graphite-nano metal composites which are dispersed on the polymer matrix, and each include nano metal particles bonded to a surface of graphite,
an insulating heat radiation coating layer formed of an insulating heat radiation coating composition on an outer surface of the bobbin,
wherein the insulating heat radiation coating layer is formed by treating an insulating heat radiation coating composition on the outer surface of the bobbin, wherein the insulating heat radiation coating composition includes a coating layer-forming component including a main resin and an insulating heat radiation filler, wherein the main resin includes a compound represented by Formula 1 below:

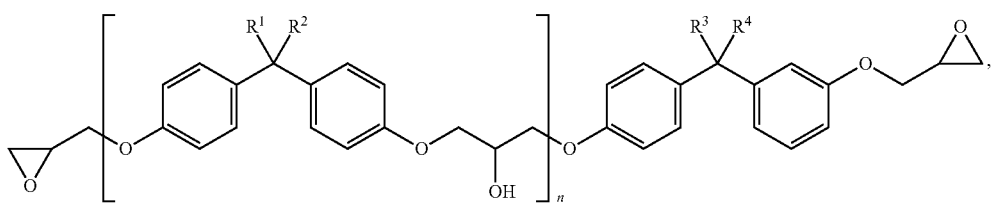

[Formula 1]

wherein $R^1$ and $R^2$ are each independently a hydrogen atom, a $C_1$-$C_5$ linear alkyl group, or a $C_3$-$C_5$ branched alkyl group, and $R^3$ and $R^4$ are each independently a hydrogen atom, a $C_1$-$C_5$ linear alkyl group, or a $C_3$-$C_5$ branched alkyl group, and n is a rational number which allows a weight average molecular weight of the compound represented by Formula 1 to be in a range of 400 to 4,000.

13. The coil component of claim 12, wherein the insulating heat radiation filler:
a) includes silicon carbide;
b) has an average particle diameter of 10 nm to 15 μm; or
c) both.

14. A coil component comprising:
a magnetic core; a bobbin configured to accommodate the magnetic core; and at least one pair of coils wound outside the bobbin,
wherein the bobbin is a heat radiation member which includes a polymer matrix and a plurality of graphite-nano metal composites which are dispersed on the polymer matrix, and each include nano metal particles bonded to a surface of graphite,
an insulating heat radiation coating layer formed of an insulating heat radiation coating composition on an outer surface of the bobbin,
wherein the insulating heat radiation coating layer is formed by treating an insulating heat radiation coating composition on the outer surface of the bobbin, wherein the insulating heat radiation coating composition includes a coating layer-forming component including a main resin and an insulating heat radiation filler, wherein the main resin is a curable resin, and the coating layer-forming component further includes a curing agent included in an amount of 25-100 parts by weight with respect to 100 parts by weight of the main resin, wherein the curing agent includes a first curing agent and a second curing agent in a weight ratio of 1:0.5 to 1:1.5, wherein the first curing agent includes an aliphatic polyamine-based curing agent and the second curing agent includes at least one selected from the group consisting of an aromatic polyamine-based curing agent, an acid anhydride-based curing agent, and a catalyst-based curing agent.

15. The coil component of claim 14, wherein the aliphatic polyamine-based curing agent includes polyethylene polyamine.

16. The coil component of claim 14, wherein the insulating heat radiation filler:
a) includes silicon carbide;
b) has an average particle diameter of 10 nm to 15 μm; or
c) both.

17. A bobbin having an empty space therein configured to accommodate a magnetic core, and having an outer surface,
wherein the bobbin is a heat radiation member which includes a polymer matrix and a plurality of graphite-nano metal composites which are dispersed on the polymer matrix, and each include nano metal particles bonded to a surface of graphite,
an insulating heat radiation coating layer formed of an insulating heat radiation coating composition on an outer surface of the bobbin,
wherein the insulating heat radiation coating layer is formed by treating an insulating heat radiation coating composition on the outer surface of the bobbin, wherein the insulating heat radiation coating composition includes a coating layer-forming component including a main resin and an insulating heat radiation filler,
wherein the insulating heat radiation coating composition has a heat radiation efficiency of 30% or more according to a thermal radiation evaluation method below:
[Heat radiation evaluation method]
after a heat source having a surface area of 4 cm² and a temperature of 88° C. is placed to be in contact with a lower center of specimen 1 which includes a 25-μm thick insulating heat radiation coating layer formed by treating an insulating heat radiation coating composition on an upper surface of an aluminum plate having a thickness of 1.5 mm and an area of 35 mm×34 mm in a closed system having a temperature of 25° C. and a humidity of 50%, temperature is measured at an upper point located 5 cm from a center of a heat radiation unit, temperature is measured in the same manner solely on specimen 2, that is, an aluminum plate on which a heat radiation coating layer is not formed, and a heat radiation efficiency is measured according to Expression 1 below:

heat radiation efficiency (%)={(temperature (° C.) of upper point located 5 cm from center of specimen 1)/(temperature (° C.) of upper point located 5 cm from center of specimen 2)−1}×100 [Expression 1].

18. The bobbin of claim 17, further comprising an insulating heat radiation coating layer coated on an outer surface of the heat radiation member.

19. The coil component of claim 17, wherein the insulating heat radiation filler:
a) includes silicon carbide;
b) has an average particle diameter of 10 nm to 15 μm; or
c) both.

* * * * *